United States Patent
Kasai

(10) Patent No.: US 10,417,963 B2
(45) Date of Patent: Sep. 17, 2019

(54) ELECTRO-OPTICAL APPARATUS, ELECTRONIC APPARATUS, AND METHOD FOR DRIVING ELECTRO-OPTICAL APPARATUS

(71) Applicant: SEIKO EPSON CORPORATION, Tokyo (JP)

(72) Inventor: Toshiyuki Kasai, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 56 days.

(21) Appl. No.: 15/909,506

(22) Filed: Mar. 1, 2018

(65) Prior Publication Data
US 2018/0268756 A1 Sep. 20, 2018

(30) Foreign Application Priority Data
Mar. 16, 2017 (JP) ................................ 2017-050918

(51) Int. Cl.
G09G 3/3233 (2016.01)
H01L 51/52 (2006.01)
G09G 3/3258 (2016.01)
G02B 27/01 (2006.01)
G09G 3/3291 (2016.01)
(Continued)

(52) U.S. Cl.
CPC ......... *G09G 3/3233* (2013.01); *G02B 27/017* (2013.01); *G09G 3/3258* (2013.01); *G09G 3/3291* (2013.01); *H01L 51/5203* (2013.01); G02B 27/0172 (2013.01); G02B 27/149 (2013.01); G09G 2300/0819 (2013.01); G09G 2300/0842 (2013.01); G09G 2300/0861 (2013.01); G09G 2310/0216 (2013.01); G09G 2310/0264 (2013.01); G09G 2320/0257 (2013.01); G09G 2330/025 (2013.01); G09G 2330/06 (2013.01); H01L 27/3276 (2013.01)

(58) Field of Classification Search
None
See application file for complete search history.

(56) References Cited

U.S. PATENT DOCUMENTS

| | | | |
|---|---|---|---|
| 6,583,775 B1* | 6/2003 | Sekiya | G09G 3/2081 345/76 |
| 2005/0253835 A1* | 11/2005 | Kawase | G09G 3/3233 345/207 |
| 2011/0025653 A1 | 2/2011 | Ikeda et al. | |

FOREIGN PATENT DOCUMENTS

| | | |
|---|---|---|
| JP | 2005-308857 A | 11/2005 |
| JP | 2008-083727 A | 4/2008 |
| JP | 2011-028135 A | 2/2011 |

* cited by examiner

*Primary Examiner* — Christopher J Kohlman
(74) *Attorney, Agent, or Firm* — Oliff PLC

(57) ABSTRACT

A scanning line driving circuit selects arbitrary one of a plurality of pixels and causes the pixel to perform a current value setting operation of setting a current value of the driving current to be supplied to the light emitting element of the pixel in a frame period before the pixel is selected again and a light emission operation of emitting light by supplying the driving current to the light emitting element. The scanning line driving circuit controls, in common with the plurality of pixels, a duty ratio corresponding to the frame period of the light emission period in which the light emission operation is performed. The scanning line driving circuit disperses time differences between a current value setting timing and a start timing of the light emission period in the plurality of pixels when the duty ratio is equal to or smaller than a predetermined value.

13 Claims, 15 Drawing Sheets

(51) Int. Cl.
*H01L 27/32* (2006.01)
*G02B 27/14* (2006.01)

ELECTRO-OPTICAL APPARATUS, ELECTRONIC APPARATUS, AND METHOD FOR DRIVING ELECTRO-OPTICAL APPARATUS

BACKGROUND

1. Technical Field

The present invention relates to an electro-optical apparatus, an electronic apparatus, and a method for driving the electro-optical apparatus.

2. Related Art

In recent years, various types of electro-optical apparatus using a light emitting element, such as an organic light emitting diode (OLED), have been proposed. As a general configuration of such an electro-optical apparatus, pixel circuits including a light emitting element and a transistor which correspond to intersections between scanning lines and data lines are disposed so as to correspond to pixels of an image to be displayed. Examples of a method for controlling luminance of an electro-optical apparatus having such a configuration include a technique of controlling average luminance by changing a length of a light emission period of the light emitting element.

For example, in an electro-optical apparatus disclosed in JP-A-2005-308857, control transistors disposed in current paths of driving current to be supplied to light emitting elements of pixels are brought into an ON state for a certain period of time in one frame period. The period in which the control transistors are in the ON state corresponds to the light emission period in which the driving current is supplied to the light emitting elements so that the light emitting elements emit light. According to the technique disclosed in JP-A-2005-308857, average luminance is controlled by changing a duty ratio which is a ratio of the light emission period to a frame period.

However, the electro-optical apparatus discloses in JP-A-2005-308857 has a problem in that a user of the electro-optical apparatus easily recognizes an afterimage when a duty ratio is small and a light emission period is short, and therefore, the user has a feeling of strangeness. Specifically, in a state in which a light emission period is short, when a head portion of the user moves, for example, and therefore, an image in gaze of the user is changed, an image received in the light emission period remains in a sense of view of the user. Therefore, the user feels as if an image before the head portion moves (that is, an afterimage) is visually recognized in a non-light emission period.

Examples of a document relating to a technique of controlling a duty ratio in the light emission period include JP-A-2011-28135, in addition to JP-A-2005-308857. According to the technique disclosed in JP-A-2011-28135, a plurality of pixels arranged in the same row is divided into at least two groups as the same type of group, duty ratios in light emission periods of the pixels are set to be equal to one another, and time differences between start timings of the light emission periods relative to periods of time in which data signals are written in the pixels are differentiated among the groups. Therefore, to avoid visual recognition of an afterimage, a method for differentiating time differences between start timings of light emission periods relative to writing periods among groups may be employed as disclosed in JP-A-2011-28135.

However, if time differences between start timings of light emission periods relative to writing periods are differentiated among groups, it may be difficult to set a long light emission period by increasing a duty ratio depending on a position of a start timing of the light emission period. Accordingly, there arises a problem in that it is difficult to realize both of differentiating of time differences between start timings of light emission periods relative to writing periods among groups and increase of tolerance of control of duty ratios in the light emission periods.

SUMMARY

An advantage of some aspects of the invention is to provide a technical unit capable of realizing suppression of generation of an afterimage while tolerance of control of a duty ratio in a light emission period is not deteriorated.

According to a first aspect of the invention, an electro-optical apparatus includes a plurality of pixels each of which includes a light emitting element which emits light based on a driving current, and a driving circuit configured to select arbitrary one of the plurality of pixels, cause the pixel to perform a current value setting operation of setting a current value of the driving current to be supplied to the light emitting element of the pixel in a frame period before the pixel is selected again and a light emission operation of emitting light by supplying the driving current to the light emitting element, and control, in common with the plurality of pixels, a duty ratio corresponding to the frame period of the light emission period in which the light emission operation is performed. The driving circuit disperses time differences between a current value setting timing when the current value setting operation is performed and a start timing of the light emission period, in the plurality of pixels when the duty ratio is equal to or smaller than a predetermined value.

Accordingly, luminance of an entire screen may be controlled by the duty ratio control in the light emission period. Furthermore, since time differences between a current value setting timing and a start timing of the light emission period in the plurality of pixels are dispersed when the duty ratio is equal to or smaller than a predetermined value, generation of an afterimage may be suppressed without deteriorating tolerance of the duty ratio control.

It is preferable that the driving circuit sets each of start timings of the light emission periods of the plurality of pixels in one of a plurality of light emission period start candidate positions arranged with a substantially even time interval in the frame period.

Accordingly, the start timings of the light emission periods are dispersed in the frame period with a substantially even time interval, and therefore, generation of an afterimage may be efficiently suppressed.

It is preferable that each of the pixels includes a driving transistor which generates the driving current. The driving circuit causes the pixel to perform a compensation operation of compensating for a threshold voltage of the driving transistor when the pixel performs the current value setting operation and determines a start timing and an end timing of the light emission period while avoiding a period in which the current value setting operation is performed.

Accordingly, switching from non-light emission to light emission of the light emitting element and switching from light emission to non-light emission are performed while the current value setting period is avoided, and therefore, the current value setting operation becomes stable.

It is preferable that the plurality of pixels are divided into a plurality of groups according to a start timing of the light emission period, and the numbers of pixels which belong to the groups are equal to one another.

Accordingly, the number of pixels in which the switching from non-light emission to light emission of light emitting elements or switching from light emission to non-light emission are simultaneously performed is constant, and therefore, flow instantaneous large consumption current may be avoided and stable operation of the electro-optical apparatus may be realized.

It is preferable that the driving circuit divides one light emission period into a plurality of sub-light emission periods and performs control of duty ratios of the sub-light emission periods.

Accordingly, a fine duty ratio control is realized when compared with a case where one light emission period is not divided into sub-light emission periods.

It is preferable that the driving circuit generates a plurality of light emission periods in one frame period.

Accordingly, an effect of suppression of flickering of the screen may be obtained in addition to an effect of suppression of generation of an afterimage.

According to a second aspect of the invention, an electronic apparatus includes the electro-optical apparatus described above. Examples of the electronic apparatus include a head mounted display and a projector.

According to a third aspect of the invention, a method for driving an electro-optical apparatus including a plurality of pixels each of which includes a light emitting element which emits light based on a driving current includes selecting arbitrary one of the plurality of pixels, causing the pixel to perform a current value setting operation of setting a current value of the driving current to be supplied to the light emitting element of the pixel in a frame period before the pixel is selected again and a light emission operation of emitting light by supplying the driving current to the light emitting element, and controlling, in common with the plurality of pixels, a duty ratio corresponding to the frame period of the light emission period in which the light emission operation is performed, and dispersing time differences between a current value setting timing when the current value setting operation is performed and a start timing of the light emission period, in the plurality of pixels when the duty ratio is equal to or smaller than a predetermined value.

Accordingly, luminance of an entire screen may be controlled by the duty ratio control in the light emission period. Furthermore, since time differences between a current value setting timing and a start timing of the light emission period in the plurality of pixels are dispersed when the duty ratio is equal to or smaller than a predetermined value, generation of an afterimage may be suppressed without deteriorating tolerance of the duty ratio control.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment

Figure 1:
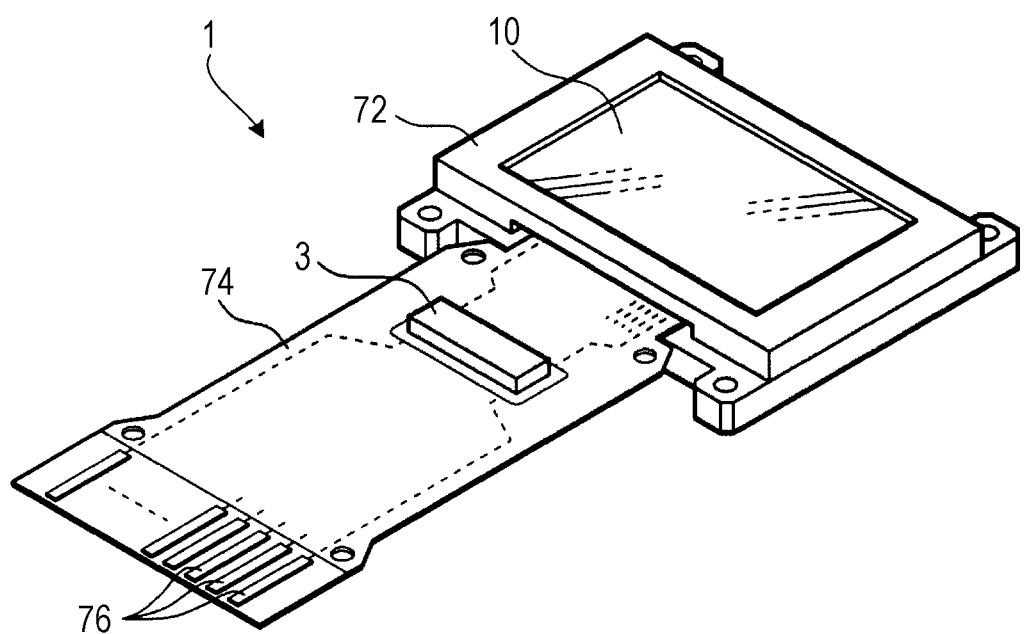
FIG. 1 is a perspective view of a configuration of an electro-optical apparatus according to an embodiment of the invention.

FIG. 1 is a perspective view of a configuration of an electro-optical apparatus 1 according to an embodiment of the invention. The electro-optical apparatus 1 is a micro display which displays an image in a head mounted display, for example. The electro-optical apparatus 1 is an organic EL apparatus including a plurality of pixel circuits and a plurality of driving circuits which drive the pixel circuits which are formed on a silicon substrate, for example. An organic light emitting diode (OLED) which is an example of a light emitting element is used in each of the pixel circuits.

The electro-optical apparatus 1 includes a display panel 10 and a control circuit 3. The display panel 10 is accommodated in a frame-shaped case 72 having an opening corresponding to a display portion, and one end of a flexible printed circuits (FPC) substrate 74 is connected to the display panel 10. The control circuit 3 of a semiconductor chip is implemented on the FPC substrate 74 by a chip-on-film (COF) technique. The control circuit 3 is connected to a higher-level circuit, not illustrated, through a plurality of terminals 76.

Figure 2:
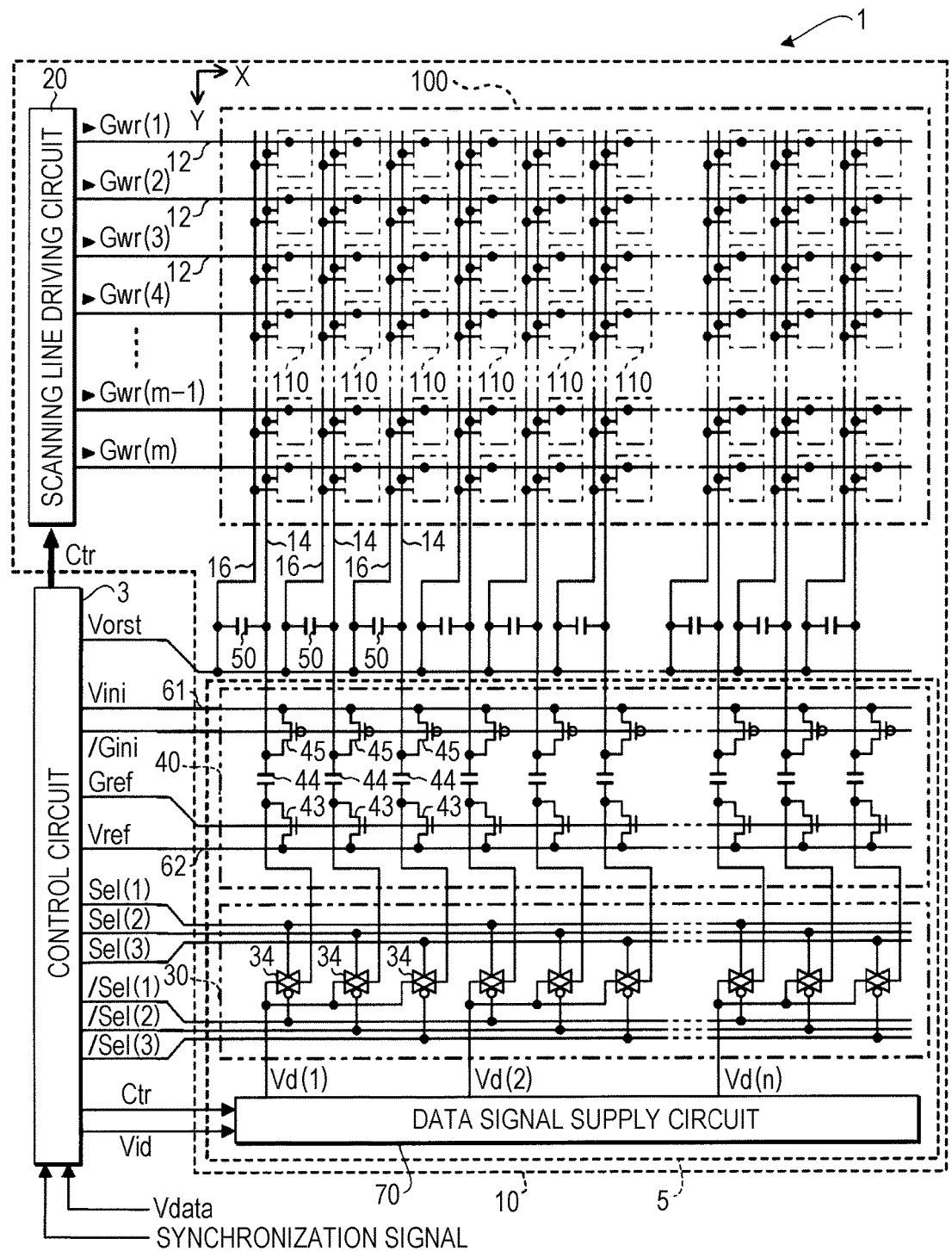
FIG. 2 is a block diagram illustrating the configuration of the electro-optical apparatus.

FIG. 2 is a block diagram illustrating the configuration of the electro-optical apparatus 1. The electro-optical apparatus 1 includes the display panel 10 and the control circuit 3 as described above.

Digital image data Vdata is supplied from a higher-level circuit, not illustrated, to the control circuit 3 in synchronization with a synchronization signal. Here, the image data Vdata defines a gradation level of a pixel of an image to be displayed in the display panel 10 (specifically, a display unit 100 described below) by 8 bits, for example. Furthermore, the synchronization signal includes a vertical synchronization signal, a horizontal synchronization signal, and a dot clock signal.

The control circuit 3 generates various control signals based on the synchronization signal and supplies the control signals to the display panel 10. Specifically, the control circuit 3 supplies a control signal Ctr, a positive logic control signal Gini, a negative logic control signal /Gini which has the logically-reversed relationship with the control signal Gini, control signals Sel(1), Sel(2), and Sel(3), and control signals /Sel(1), /Sel(2), and /Sel(3) which have the logically reversed relationship with the control signals Sel(1), Sel(2), and Sel(3). Here, the control signal Ctr includes a plurality of signals, such as a pulse signal, a clock signal, and an enabling signal. Note that the control signals Sel(1), Sel(2), and Sel(3) are collectively referred to as a control signal Sel and the control signals /Sel(1), /Sel(2), and /Sel(3) are collectively referred to as a control signal /Sel where appropriate.

The control circuit 3 further includes a voltage generation circuit. The voltage generation circuit supplies various potentials to the display panel 10. Specifically, the control circuit 3 supplies a potential Vorst, an initial potential Vini, and a potential Vref to the display panel 10.

Furthermore, the control circuit 3 generates an analog image signal Vid based on the image data Vdata. Specifically, the control circuit 3 includes a look-up table in which potentials represented by the image signals Vid are associated with luminance of a light emitting element (an OLED 130 described below) included in the display panel 10. Then the control circuit 3 generates an image signal Vid representing a potential corresponding to luminance of a light emitting element specified by the image data Vdata with reference to the look-up table and supplies the image signal Vid to the display panel 10.

As illustrated in FIG. 2, the display panel 10 includes the display unit 100 and a driving circuit (a data transfer line driving circuit 5 and a scanning line driving circuit 20) which drives the display unit 100.

The display unit 100 includes pixel circuits 110 which correspond to pixels of an image to be displayed and which are arranged in a matrix. Specifically, in the display unit 100, scanning lines 12 in m rows extend in a horizontal direction in FIG. 2, and data lines 14 in 3n columns which are grouped every three columns extend in a vertical direction in FIG. 2 and have electric insulation from the scanning lines 12. Then the pixel circuits 110 are disposed so as to correspond to intersecting portions between the scanning lines 12 in the m rows and the data lines 14 in the 3n columns. Therefore, the pixel circuits 110 are arranged in a matrix of m rows by 3n columns in this embodiment.

Here, "m" and "n" denote natural numbers. The rows are referred to as a first row to an m-th row from the top of FIG. 2 where appropriate so that the individual rows are discriminated from one another in the scanning lines 12 and the matrix of the pixel circuits 110. Similarly, the columns are referred to as a first column to a 3n-th column from the left of FIG. 2 where appropriate so that the individual columns are discriminated from one another in the data lines 14 and the columns of the matrix of the pixel circuits 110. Furthermore, assuming that "j" is an integer equal to or larger than 1 and equal to or smaller than n so that the groups of the data lines 14 are generally illustrated, the data lines 14 of a (3j−2)-th column, a (3j−1)-th column, and a 3j-th column belong to a j-th group from the left.

Note that three pixel circuits 110 which correspond to intersections between a scanning line 12 in the same row and data lines 14 in three columns in the same group correspond to pixels of R (red), G (green), and B (blue), and the three pixels represent one dot of a color image to be displayed. Specifically, in this embodiment, a color in one dot is represented by additive color mixing by light emission of the OLED corresponding to R, G, and B.

In this embodiment, power supply lines 16 (third power supply lines) are disposed along the data lines 14 in the individual columns. The potential Vorst is supplied to the individual power supply lines 16 in common. Furthermore, retention volumes 50 are disposed in the individual columns. Specifically, each of the retention volumes 50 has one end connected to a corresponding one of the data lines 14 and the other end connected to a corresponding one of the power supply lines 16. Therefore, the retention volumes 50 function as second retention volumes which hold potentials of the data lines 14.

In a preferred embodiment, each of the retention volumes 50 is formed by sandwiching an insulating body (a dielectric body) by a line constituting a corresponding one of the data lines 14 and a line constituting a corresponding one of the power supply lines 16.

Furthermore, the retention volumes 50 are disposed out of the display unit 100 in FIG. 2. However, this configuration is merely an example. The retention volumes 50 may be disposed in the display unit 100 or disposed inside and outside the display unit 100. Furthermore, although not illustrated in FIG. 2, the retention volumes 50 are denoted by "Cdt" where appropriate.

The data transfer line driving circuit 5 includes a demultiplexer 30, a data transfer circuit 40, and a data signal supply circuit 70. The data signal supply circuit 70 outputs data signals Vd(1) to Vd(n) to corresponding first to n-th blocks at a selection timing of the demultiplexer 30. Note that a highest value of potentials of the data signals Vd(1) to Vd(n) is denoted by Vmax and a lowest value is denoted by Vmin.

The scanning line driving circuit 20 successively selects the plurality of pixel circuits 110 arranged in a matrix and performs driving control on the individual pixel circuits 110. The scanning line driving circuit 20 repeatedly performs the operation of successively selecting the pixel circuits 110 in a unit of row. Specifically, the scanning line driving circuit 20 generates a scanning signal for successively scanning the scanning lines 12 on a row-by-row basis based on a control signal Ctr in one frame period 1F. Here, the one frame period 1F represents a period of time required for display of an image of one cut (frame) performed by the electro-optical apparatus 1. When a frequency of a vertical synchronization signal included in the synchronization signal is 120 Hz, the one frame period 1F is 8.3 milliseconds corresponding to one period. Hereinafter, scanning signals to be supplied to the scanning lines 12 in the first to m-th rows are denoted by Gwr(1) to Gwr(m). Then the scanning line driving circuit 20 causes each of the pixel circuits 110 to perform a current value setting operation of setting a current value of a driving current to be supplied to the OLED 130 in the pixel circuit 110 in the one frame period 1F from when the pixel circuit 110 is selected to when the same pixel circuit 110 is selected again and a light emission operation of emitting light by supplying the driving current to the OLED 130.

Although the scanning line driving circuit 20 generates various control signals which are synchronized with the scanning signals Gwr(1) to Gwr(m) for individual rows, in addition to the scanning signals Gwr(1) to Gwr(m), and supplies the signals to the display unit 100 so as to control driving of the driving circuits 110, the signals are omitted in FIG. 2.

Then the scanning line driving circuit 20 has a function of commonly controlling duty ratios of the pixel circuits 110 in the one frame period 1F of the light emission period in which the pixel circuits 110 perform the light emission operation in this embodiment. Furthermore, the scanning line driving circuit 20 has a function of dispersing time differences between current value setting timings when the current value setting operation is performed in the pixel circuits 110 and start timings of the light emission period when the duty ratios are equal to or smaller than a predetermined value. Note that a configuration of the scanning line driving circuit 20 which realizes the function will be described hereinafter in detail.

The demultiplexer 30 is an aggregate of transmission gates 34 disposed in the individual columns, and successively supplies a data signal to three columns included in each of the groups.

Here, input terminals of the transmission gates 34 corresponding to the (3j−2)-th column, the (3j−1)-th columns, and the 3j-th column which belong to the j-th group are connected to one another in common, and a data signal Vd(j) is supplied to a common terminal.

The transmission gate 34 in the (3j−2)-th column which is a leftmost end column in the j-th group is turned ON (conductive) when a control signal Sel(1) is in a high level (that is, when a control signal /Sel(1) is in a low level). Similarly, the transmission gate 34 in the (3j−1)-th column in a middle column in the j-th group is turned ON when a control signal Sel(2) is in a high level (that is, when a control signal /Sel(2) is in a low level), and the transmission gate 34 in the 3j-th column in a rightmost end column in the j-th group is turned ON when a control signal Sel(3) is in a high level (that is, when a control signal /Sel (3) is in a low level).

The data transfer circuit 40 includes groups of a retention volume 44, a P-channel MOS transistor 45, and an N-channel MOS transistor 43 in the individual columns, and shifts potentials of data signals output from output terminals of the transmission gates 34 in the individual columns. Here, the retention volume 44 has one terminal connected to a corresponding one of the data lines 14 in the columns and a drain node of the transistor 45 and the other terminal connected to a corresponding one of the output terminals of the transmission gates 34 and a drain node of the transistor 43. Therefore, the retention volume 44 functions as a first retention volume having one terminal connected to a corresponding one of the data lines 14. Although not illustrated in FIG. 2, a capacitance of the retention volume 44 is denoted by "Crf1".

Source nodes of the transistors 45 in the individual columns are connected to a power supply line 61 which supplies the potential Vini as an initial potential in common, and a control signal /Gini is supplied to gate nodes of the transistors 45 in common. Therefore, the transistors 45 electrically connect the corresponding data lines 14 to the power supply line 61 when the control signal /Gini is in a low level and electrically disconnect the corresponding data lines 14 from the power supply line 61 when the control signal /Gini is in a high level.

Source nodes of the transistors 43 in the individual columns are connected to a power supply line 62 which supplies the potential Vref as a predetermined potential in common, and a control signal Gref is supplied to gate nodes of the transistors 43 in common. Therefore, the transistors 43 electrically connect the nodes h which are one ends of the retention volumes 44 to the power supply line 62 when the control signal Gref is in a high level and electrically disconnect the nodes h from the power supply line 62 when the control signal Gref is in a low level.

Although the scanning line driving circuit 20, the demultiplexer 30, and the data transfer circuit 40 are separately provided for convenience in this embodiment, they may be a collective concept as a driving circuit which drives the pixel circuits 110.

The pixel circuits 110 will be described with reference to FIG. 3. The pixel circuits 110 electrically have the same configuration, and therefore, one of the pixel circuits 110 in an i-th row and a (3j−2) column which is located in the i-th row and the (3j−2)-th column which is the leftmost end column in the j-th group will be described as an example. Note that "i" is a sign which generally indicates a row where each of the pixel circuits 110 is located and is an integer equal to or larger than 1 and equal to and smaller than m.

Figure 3:
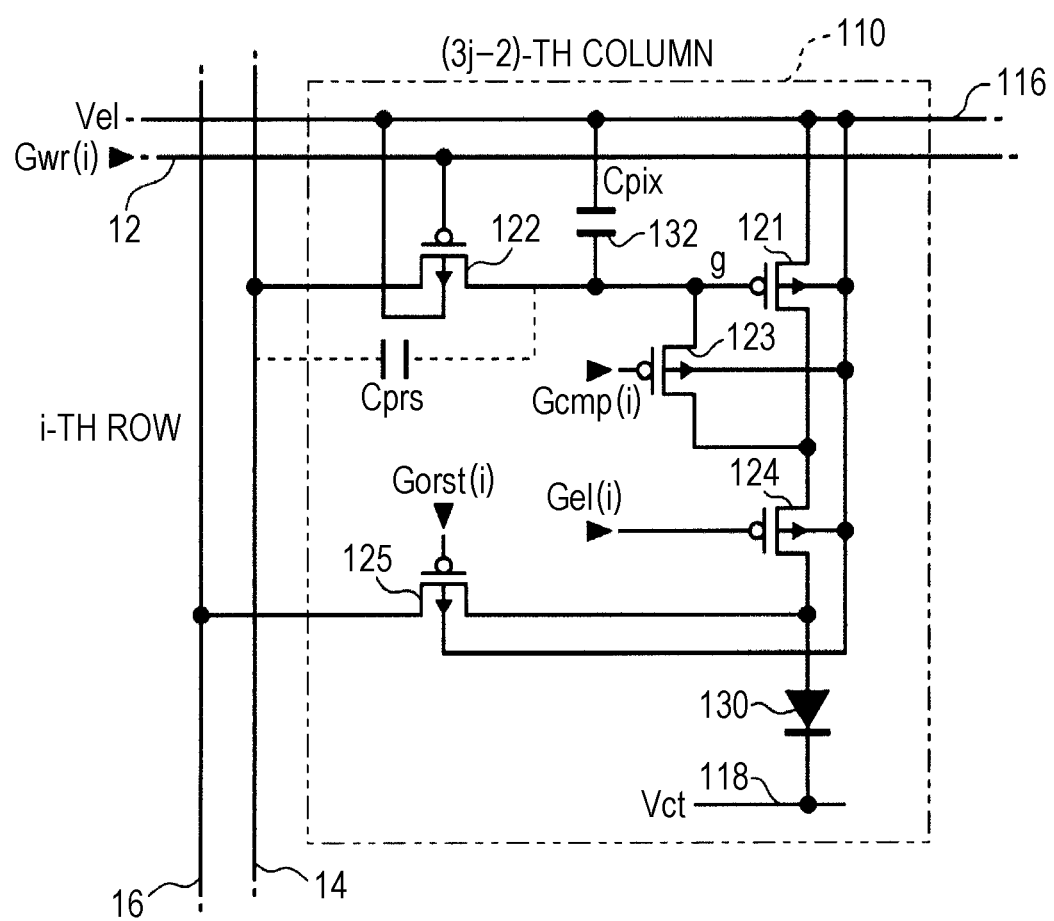
FIG. 3 is a circuit diagram illustrating a configuration of a pixel circuit of the electro-optical apparatus.

As illustrated in FIG. 3, the pixel circuit 110 includes P-channel MOS transistors 121 to 125, the OLED 130, and a retention volume 132. A scanning signal Gwr(i) and control signals Gel(i), Gcmp(i), and Gorst(i) are supplied to the pixel circuit 110. Here, the scanning signal Gwr(i) and the control signals Gel(i), Gcmp(i), and Gorst(i) are supplied to the pixel circuits 110 in the i-th row by the scanning line driving circuit 20. Specifically, the scanning signal Gwr(i) and the control signals Gel(i), Gcmp(i), and Gorst(i) are supplied in common to the pixel circuits in columns other than the (3j−2)-th column of interest in the i-th row.

In the transistor 122 included in the pixel circuit 110 in the i-th row and the (3j−2)-th column, a gate node is connected to the scanning line 12 in the i-th row, one of a drain node and a source node is connected to the data line 14 in the (3j−2)th column, and the other of the drain node and the source node is connected to a gate node g of the transistor 121, an end of the retention volume 132, and a source node of the transistor 123. Here, the gate node of the transistor 121 is denoted by "g" so as to discriminate the gate node of the transistor 121 from the other nodes.

The transistor 121 is a driving transistor which generates a driving current for the OLED 130. The transistor 121 has a source node connected to a power supply line 116 and a drain node connected to a drain node of the transistor 123 and a source node of the transistor 124. Here, the control signal Gcmp(i) is supplied to a gate node of the transistor 123. Furthermore, a potential Vel which is a high potential side of a power source in the pixel circuit 110 is supplied to the power supply line 116.

In the transistor 124, the control signal Gel(i) is supplied to a gate node, and a drain node is connected to a source node of the transistor 125 and an anode of the OLED 130. The transistor 124 functions as a switching element disposed in a current path of a driving current to be supplied to the OLED 130. Then, the transistor 124 is turned ON when the OLED 130 is to be emitted, and is turned OFF when the OLED 130 is not to be emitted.

In the transistor 125, the control signals Gorst(i) corresponding to the i-th row is supplied to a gate node, and a drain node is connected to the power supply lines 16 corresponding to the (3j−2)-th column and maintains a potential Vorst.

The retention volume 132 has the other terminal connected to the power supply line 116. Therefore, the retention volume 132 holds a voltage between the gate and the source of the transistor 121. Here, when a capacitance of the retention volume 132 is denoted by "Cpix", a capacitance Cdt of the retention volume 50, a capacitance Crf1 of the retention volume 44, and the capacitance Cpix of the retention volume 132 satisfy the following relationship:

$$Cdt \gtrsim Crf1 \gg Cpix \quad (1)$$

Specifically, the capacitance Cdt is equal to or larger than the capacitance Crf1 and the capacitance Cpix is sufficiently smaller than the capacitances Cdt and Crf1.

Note that a parasitic capacitance of the gate node g of the transistor 121 may be used as the retention volume 132 or a capacitance formed by sandwiching an insulation layer by different conductive layers in the silicon substrate may be used.

Since the electro-optical apparatus 1 is formed on the silicon substrate in this embodiment, a substrate potential of the transistors 121 to 125 is the potential Vel.

The anode of the OLED 130 is a pixel electrode individually provided for each pixel circuit 110. On the other hand, a cathode of the OLED 130 is a common electrode 118 which is common in all the pixel circuits 110 and maintains a potential Vct on a low potential side of the power source in the pixel circuit 110.

The OLED 130 is an element formed by sandwiching a white organic electro luminescence (EL) layer by an anode and a cathode having light permeability on the silicon substrate. Then a color filter corresponding to one of R, G, and B is overlapped on a light emission side (a cathode side) of the OLED 130.

In such an OLED 130, when current is supplied from the anode to the cathode, a positive hole poured from the anode and electrons poured from the cathode are recombined with each other in the organic EL layer so that excitation is generated and white light is generated. The white light generated here is transmitted through the cathode on a side opposite to a side of the silicon substrate (the anode), colored by the color filter, and thereafter, recognized by an observer. Note that a cavity structure may be formed by controlling an optical distance between two reflection layers arranged opposite to each other with the white organic EL layer interposed therebetween so that a wavelength of light emitted by the OLED 130 is set. In this case, the color filter may be provided or may not be provided.

Figure 4:
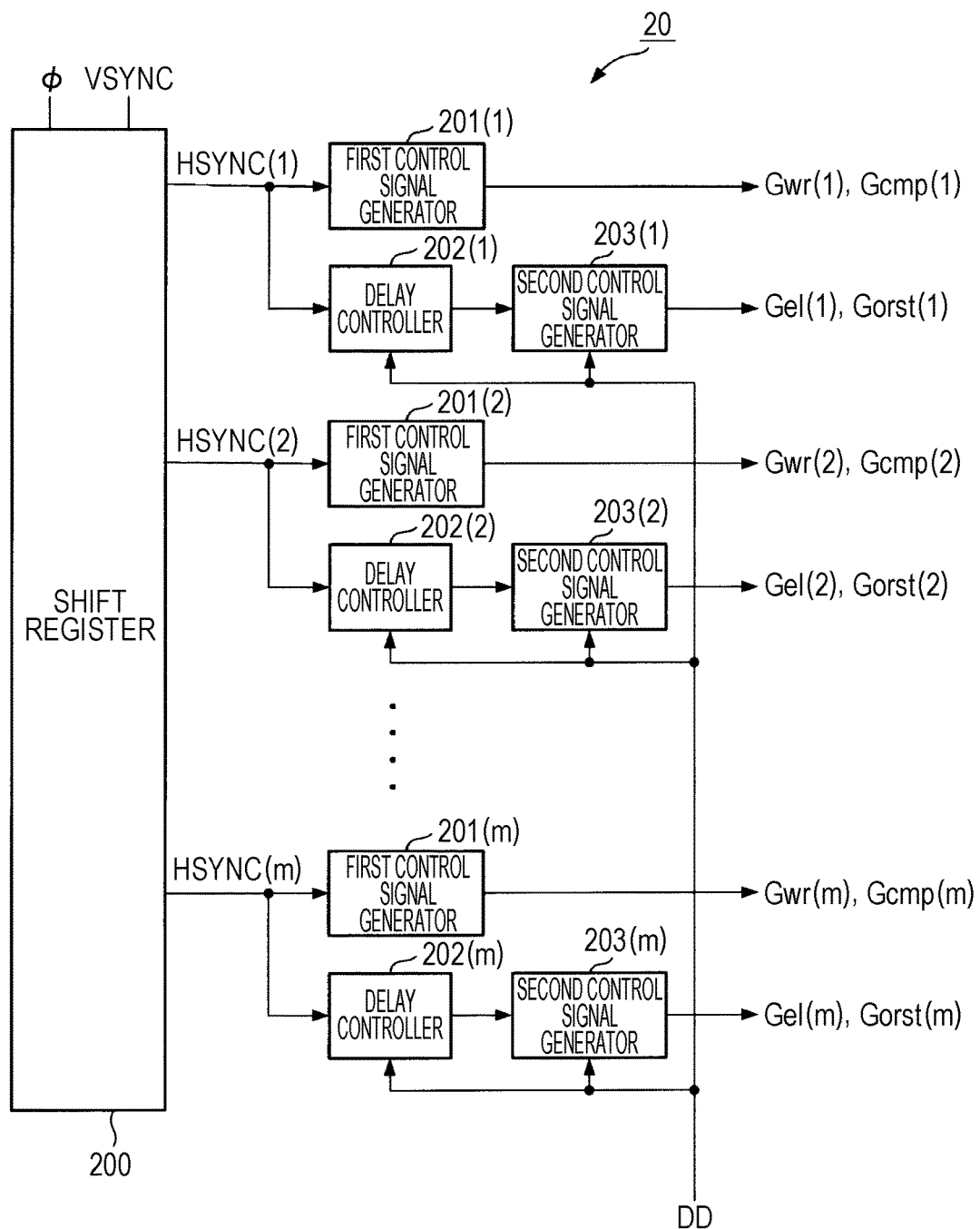
FIG. 4 is a block diagram illustrating a configuration of a scanning line driving circuit of the electro-optical apparatus.

FIG. 4 is a block diagram illustrating a configuration of the scanning line driving circuit 20 according to this embodiment. In the scanning line driving circuit 20, a shift register 200 has a number of stages corresponding to the number of scanning lines and repeatedly performs an operation of successively shifting an edge of a vertical synchronization signal VSYNC to a subsequent stage by a clock φ which is synchronized with a horizontal scanning period. Horizontal synchronization signals HSYNC(i) (i=1 to m) indicating start of the horizontal scanning period is output from stages i of the shift register 200. Then a group of a first control signal generator 201(i), a delay controller 202(i), and a second control signal generator 203(i) is disposed in each of the stages i of the shift register 200.

The first control signal generator 201(i) generates a scanning signal Gr(i) and a control signal Gcmp(i) to be supplied to the pixel circuit 110 in each of the pixels connected to the i-th scanning line in response to an output of the horizontal synchronization signal HSYNC(i) from the i-th stage of the shift register 200.

Duty ratio data DD which indicates a duty ratio in the light emission period is supplied to the delay controller 202(i) and the second control signal generator 203(i).

The delay controller 202(i) outputs a trigger signal twice in response to the horizontal synchronization signal HSYNC(i) output from the i-th stage of the shift register 200. The trigger signal indicates start of the light emission period. A mode of generation of the trigger signal performed twice is determined depending on a result of a determination as to whether a duty ratio represented by the duty ratio data D is equal to or smaller than a predetermined threshold value or a result of a determination as to whether the delay controller 202(i) corresponds to a scanning line in an odd-numbered row or an even-numbered row.

When the duty ratio indicated by the duty ratio data DD is larger than the predetermined threshold value, the delay controller 202(i) outputs a trigger signal at a timing delayed from the horizontal synchronization signal HSYNC(i) by a first delay time and a trigger signal at a timing delayed from the horizontal synchronization signal HSYNC(i) by a second delay time irrespective of a result of a determination as to whether the delay controller 202(i) corresponds to a scanning line in an odd-numbered row or an even-numbered row. Here, the first and second delay times has a time difference corresponding to a half of one frame period 1F.

A mode of generation of trigger signals when a duty ratio denoted by the duty ratio data DD is equal to or smaller than the predetermined threshold value is described as follows. The delay controller 202(i) corresponding to a scanning line in an odd-numbered row outputs a trigger signal at the timing delayed from the horizontal synchronization signal HSYNC(i) by the first delay time and a trigger signal at the timing delayed from the horizontal synchronization signal HSYNC(i) by the second delay time similarly to the case where the duty ratio is larger than the predetermined threshold value. However, the delay controller 202(i) corresponding to a scanning line in an even-numbered row outputs a trigger signal at a timing delayed from the horizontal synchronization signal HSYNC(i) by a third delay time which is longer than the first delay time and a trigger signal at a timing delayed from the horizontal synchronization signal HSYNC(i) by a fourth delay time which is longer than the second delay time. The third delay time corresponds to a quarter of the one frame period 1F. The fourth delay time corresponds to three quarters of the one frame period 1F.

The second control signal generator 203(i) outputs a negative pulse having a pulse width corresponding to the duty ratio denoted by the duty ratio data DD as the control signal Gel(i) every time a trigger signal is output from the delay controller 202(i). The pulse width of the control signal Gel(i) corresponds to a light emission period of the OLED 130. Furthermore, the second control signal generator 203(i) maintains the control signal Gorst(i) in a high level while maintaining the control signal Gel(i) in a low level.

Figure 5:
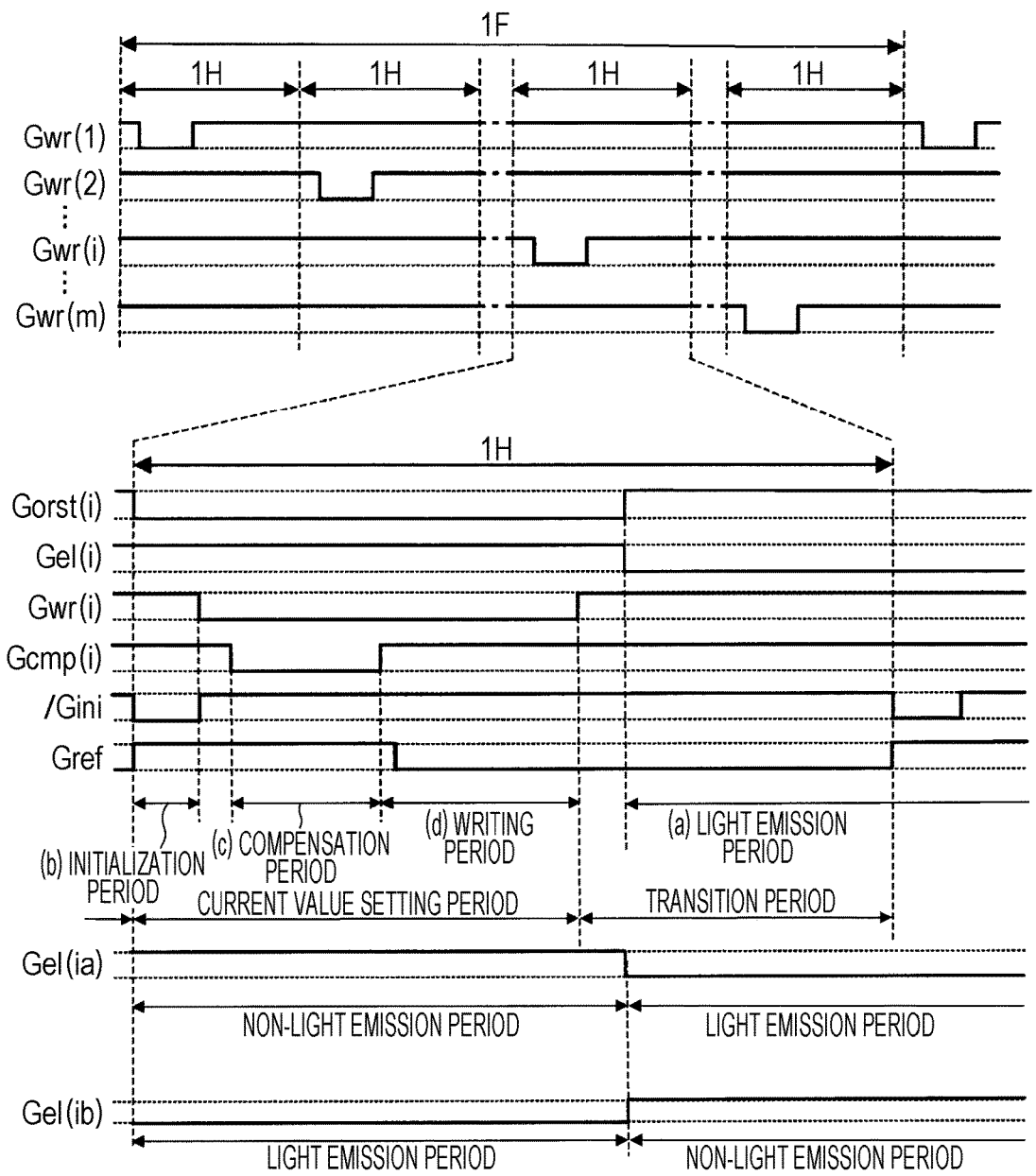
FIG. 5 is a timing chart of an operation of the electro-optical apparatus.

Next, an operation according to this embodiment will be described. FIG. 5 is a timing chart illustrating operations of the units included in the electro-optical apparatus 1. As illustrated in FIG. 5, the scanning signals Gwr(1) to Gwr(m) are successively brought into a low level so that the scanning lines 12 in the first to m-th rows are successively scanned in the one frame period 1F. Here, a period of time from when one of the plurality of scanning lines 12 is selected to when a next one of the scanning lines 12 is selected is represented as a horizontal scanning period 1H. In this example, the one frame period 1F is constituted by m horizontal scanning periods.

Operations of the pixel circuits 110 in the individual rows are the same as one another in the horizontal scanning period 1H. Therefore, an operation is described taking the pixel circuit 110 in the i-th row and the (3j−2)-th column as an example in a horizontal scanning period in which the i-th row is subjected to horizontal scanning hereinafter.

In this embodiment, a cycle from an initialization period, a compensation period, a writing period, a light emission period (a first time), to a light emission period (a second time) is generated in the one frame period 1F. As a characteristic of this embodiment, a light emission period is generated twice in the one frame period 1F. In FIG. 5, among the periods generated in the one frame period 1F, (b) the initialization period, (c) the compensation period, (d) the writing period, and (a) the light emission period (the first time) are illustrated whereas the light emission period (the second time) is omitted.

A period of time from start of the initialization period to an end of the writing period is a current value setting period in which a current value of a driving current is set to the pixel circuits 110 corresponding to a selected one of the scanning lines 12. Although the current value setting period includes the initialization period, the compensation period, and the writing period in this example, the current value setting period is arbitrarily configured. In one horizontal scanning period (H), a period other than the current value setting period is referred to as a transition period. The scanning line driving circuit 20 shifts a state of the OLED 130 from one of a light emission state and a non-light emission state to the other in the transition period to control luminance of an entire screen in this embodiment.

FIGS. 6 to 9 are diagrams illustrating states of the pixel circuit 110 disposed in the i-th row and the (3j−2)-th column in (a) the light emission period, (b) the initialization period, (c) the compensation period, and (d) the writing period, respectively. In FIGS. 6 to 9, paths which are important in operation descriptions are denoted by a bold line.

Light Emission Period operations in the initialization period, the compensation period, and the writing period included in the current value setting period are performed to cause the OLED 130 to emit light with appropriate luminance corresponding to a data signal in the light emission period. Accordingly, understanding of the operation in the light emission period is required to understand meanings of the operations in the initialization period, the compensation period, and the writing period. Therefore, the operation in the light emission period will first be described.

As illustrated in FIG. 5, in the light emission period in which pixels in the i-th row emit light, the scanning signal Gwr(i) is brought into a high level. The control signal Gel(i) is brought into a low level, and the control signals Gorst(i) and Gcmp(i) are brought into a high level.

Figure 6:
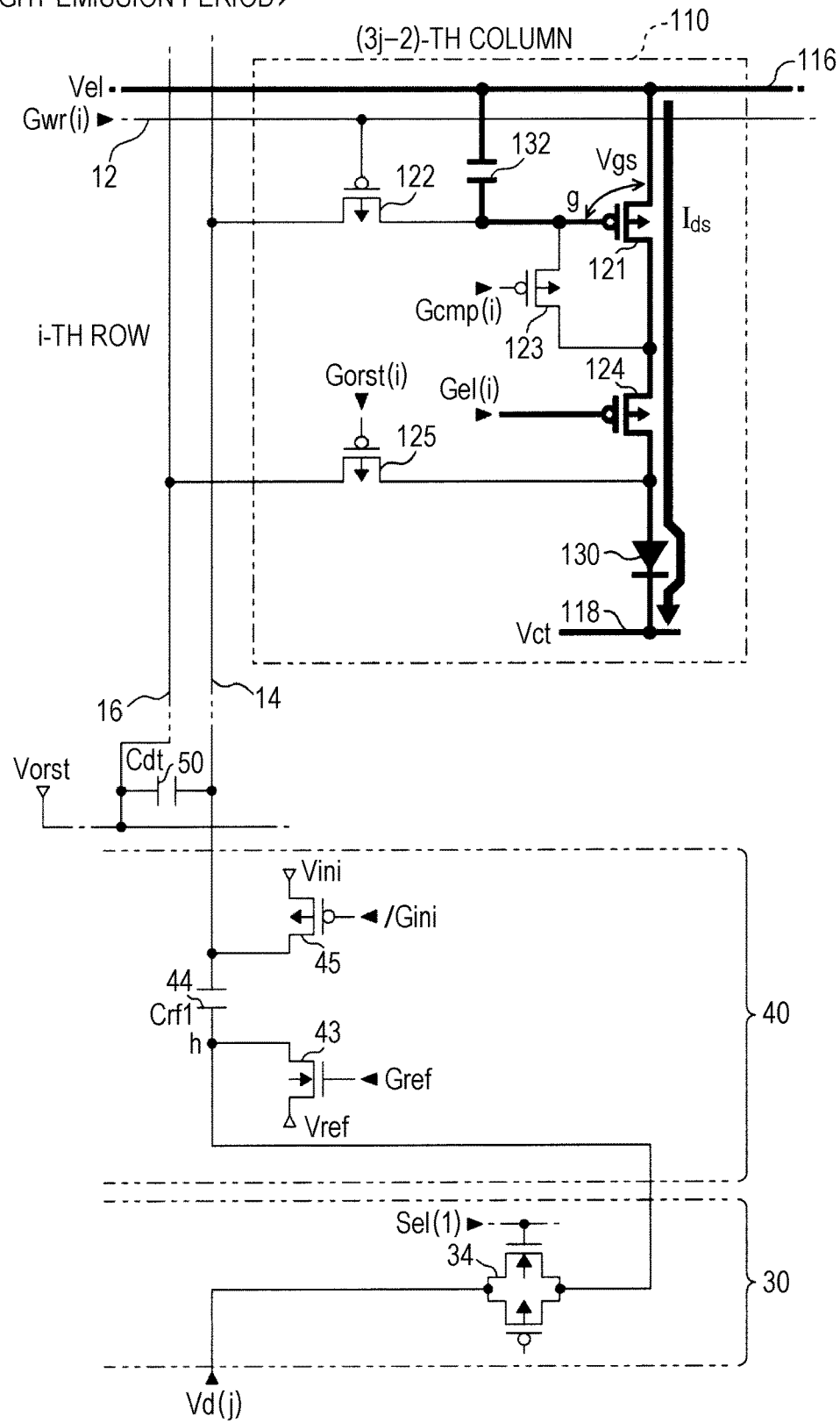
FIG. 6 is a diagram illustrating an operation of the electro-optical apparatus.

Therefore, as illustrated in FIG. 6, in the pixel circuit 110 in the i-th row and the (3j−2)-th column, the transistor 124 is turned ON whereas the transistors 122, 123, and 125 are turned OFF. Therefore, the transistor 121 supplies a current Ids corresponding to a voltage Vgs between the gate and the source to the OLED 130.

In this embodiment, a value obtained by performing level shift from a threshold voltage of the transistor 121 based on a potential of a data signal through operations in the initialization period, the compensation period, and the writing period described below is determined as the voltage Vgs in the light emission period. Therefore, in the light emission period, current corresponding to a gradation level is supplied to the OLED 130 in a state in which the threshold voltage of the transistor 121 is compensated for.

Initialization Period

When a horizontal scanning period in the i-th row is entered, first, (b) the initialization period is started. In the initialization period, the scanning signal Gwr(i) is brought into a high level. Furthermore, the control signals Gel(i) and Gcmp(i) are brought into a high level, and the control signal Gorst(i) is brought into a low level.

Figure 7:
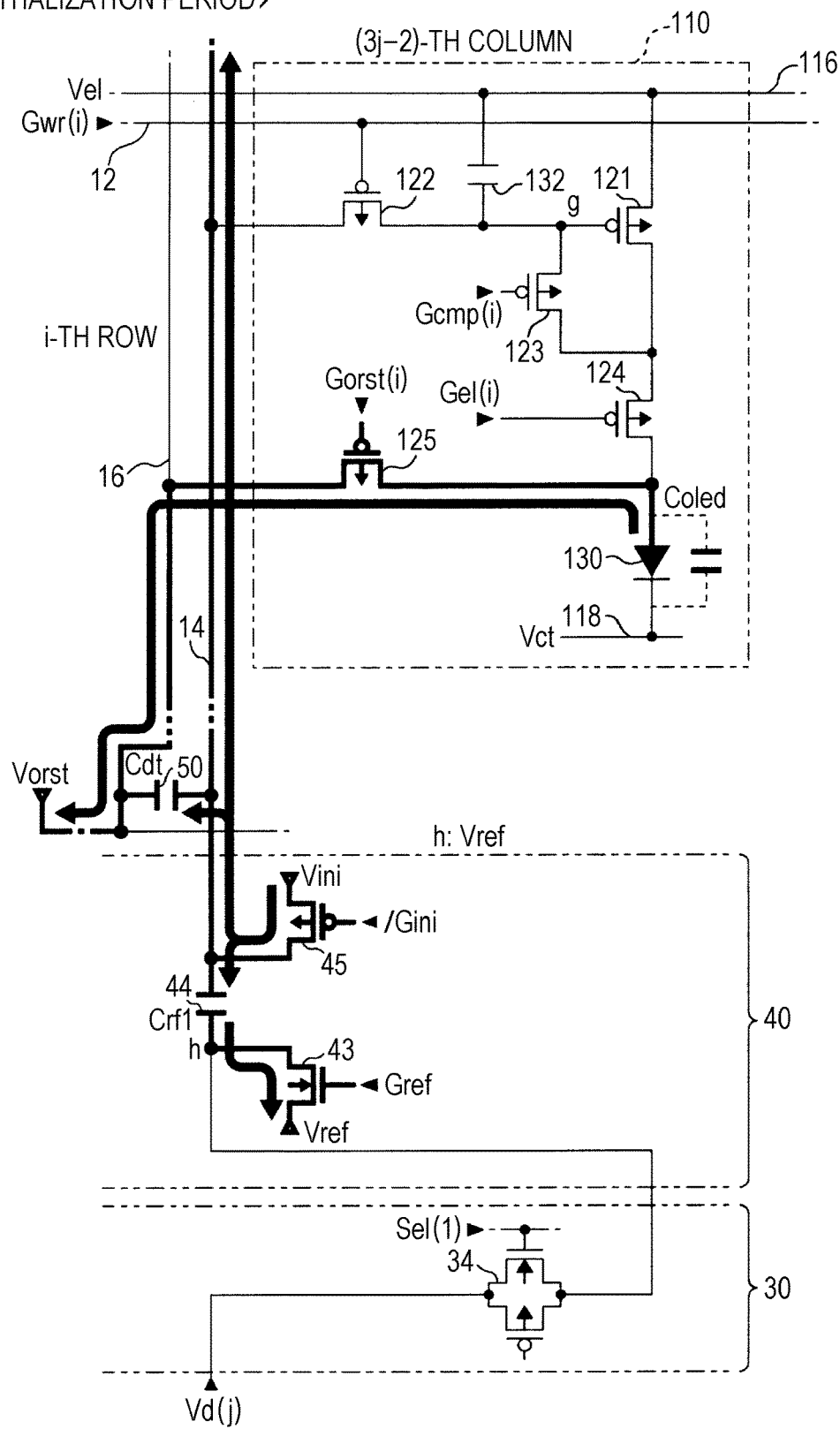
FIG. 7 is a diagram illustrating an operation of the electro-optical apparatus.

Therefore, as illustrated in FIG. 7, in the pixel circuit 110 in the i-th row and the (3j−2)-th column, the transistor 124 is turned OFF whereas the transistor 125 is turned ON. By this, a path of current supplied from the transistor 121 to the OLED 130 is disconnected and the anode of the OLED 130 is reset to a potential Vorst.

Since the OLED 130 is formed by sandwiching the organic EL layer by the anode and the cathode as described above, a parasitic capacitance Coled is disposed between the anode and the cathode in parallel to the OLED 130 as denoted by a dotted line in FIG. 7. When current is supplied to the OLED 130 in the light emission period, voltages in both edges between the anode and the cathode of the OLED 130 are held by the capacitance Coled. In the initialization period, the held voltage is reset when the transistor 125 is turned ON. Therefore, in this embodiment, when current is supplied to the OLED 130 again in the light emission period in a later stage, influence of the voltage held by the capacitance Coled is small.

Specifically, if the resetting is not performed when a display state in high luminance is shifted to a display state in low luminance, for example, a high voltage obtained when the luminance is high (a large current is supplied) is held, and therefore, excessive current is supplied although a small current is to be supplied. Accordingly, the display state in the low luminance may not be entered. On the other hand, in this embodiment, a potential of the anode of the OLED 130 is reset when the transistor 125 is turned ON, and therefore, reproducibility in lower luminance is improved.

Note that, in this embodiment, as for the potential Vorst, a difference between the potential Vorst and a potential Vct of the common electrode 118 is smaller than a light emission threshold voltage of the OLED 130. Therefore, in the initialization period (and the compensation period and the writing period described below), the OLED 130 is in an OFF (non-light emission) state.

On the other hand, since the control signal /Gini is brought into a low level and the control signal Gref is brought into a high level in the initialization period, the transistors 45 and 43 are individually turned ON in the data transfer circuit 40 as illustrated in FIG. 7. Therefore, the data line 14 which is one terminal of the retention volume 44 is initialized to the potential Vini and a node h which is the other terminal of the retention volume 44 is initialized to the potential Vref.

In this embodiment, as for the potential Vini, a result of an expression "Vel−Vini" is larger than a threshold voltage |Vth| of the transistor 121. Note that, the transistor 121 is a P-channel type, and therefore, the threshold voltage Vth based on potentials of the source and the node has a negative value. Accordingly, to avoid complication of the relationship between a high voltage and a low voltage in description, the threshold voltage is represented by an absolute value "|Vth|" and is defined by a magnification relationship.

Furthermore, the voltage Vref is set such that a potential of the node h rises in the writing period in a later stage relative to a potential to be set to the data signals Vd(1) to Vd(n), or a value lower than a lowest value Vmin, for example.

Compensation Period

In the horizontal scanning period in the i-th row, (c) the compensation period is subsequently entered. In the compensation period, unlike the initialization period, the scanning signal Gwr(i) and the control signal Gcmp(i) are brought into a low level. On the other hand, in the compensation period, the control signal /Gini is brought into a high level in a state in which the control signal Gref is maintained in the high level.

Figure 8:
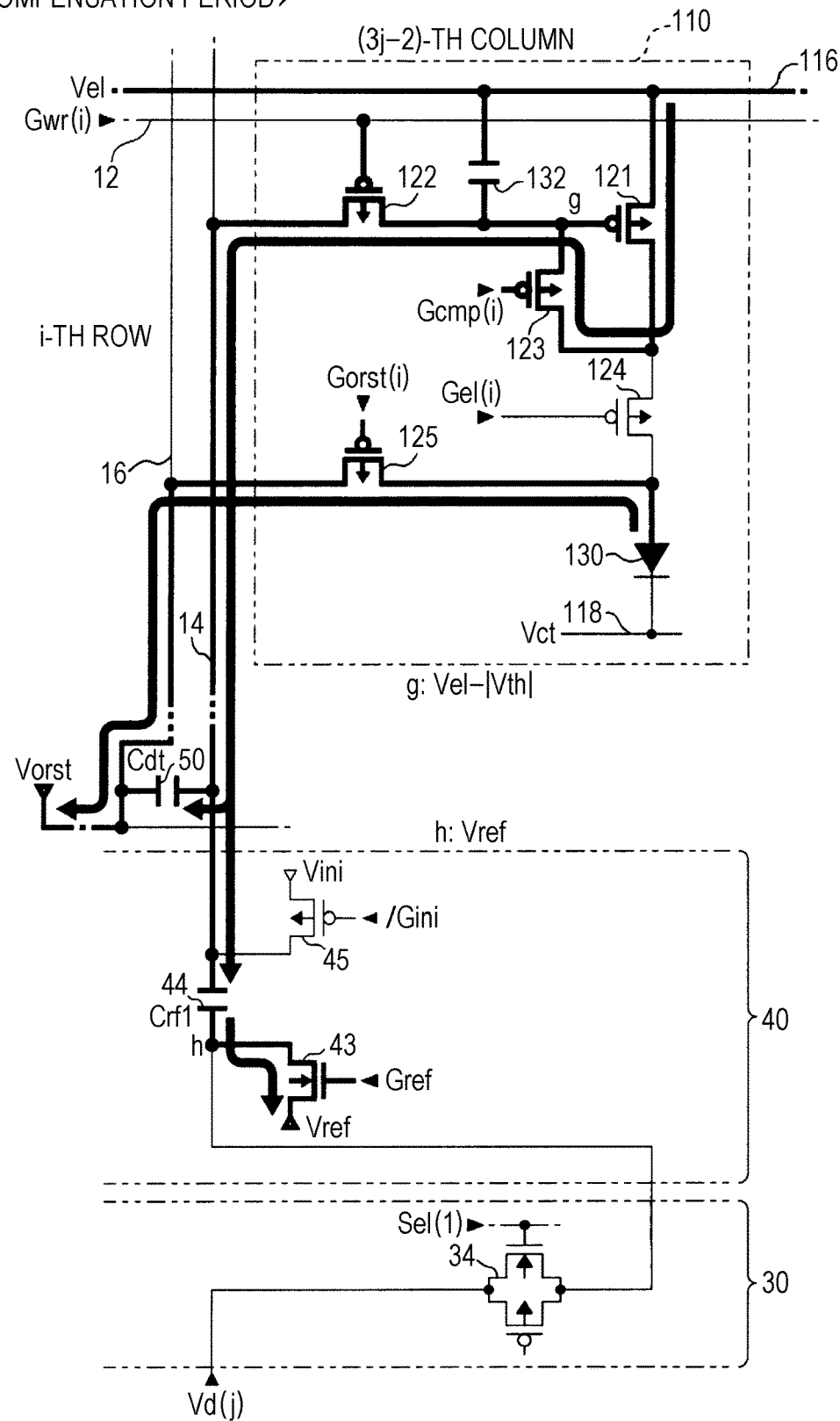
FIG. 8 is a diagram illustrating an operation of the electro-optical apparatus.

Therefore, as illustrated in FIG. 8, in the data transfer circuit 40, the node h is fixed to the potential Vref when the transistor 45 is turned OFF in a state in which the transistor 43 is in an ON. On the other hand, the gate node g is electrically connected to the data line 14 when the transistor 122 is turned ON in the pixel circuit 110 in the i-th row and (3j−2)-th column, and therefore, the gate node g has the potential Vini at the beginning of the compensation period.

Since the transistor 123 is turned ON in the compensation period, the transistor 121 is involved in diode connection. Therefore, a drain current is supplied to the transistor 121 so as to charge the gate node g and the data line 14. Specifically, the current flows in a path from the power supply line 116, the transistor 121, the transistor 123, the transistor 122, and the data line 14 in the (3j−2)-th column. Therefore, the potentials of the data line 14 and the gate node g which are connected to each other since the transistor 121 is in the ON state rise from the potential Vini.

Note that the current flowing in the path becomes difficult to flow as the potential of the gate node g becomes close to a potential (Vel−|Vth|), and therefore, the data line 14 and the gate node g are saturated in the potential (Vel−|Vth|) before the end of the compensation period. Accordingly, the retention volume 132 holds a threshold voltage |Vth| of the transistor 121 before the compensation period is terminated.

Writing Period

After the compensation period, (d) the writing period is entered. Since the control signal Gcmp(i) is brought into a high level in the writing period, the diode connection of the transistor 121 is cancelled and the control signal Gref is brought into a low level and therefore, the transistor 43 is turned OFF. Therefore, although a path from the data line 14 in the (3j−2)-th column to the gate node g in the pixel circuit 110 in the i-th row and the (3j−2)-th column is brought into a floating state, a potential of the path is maintained in (Vel−|Vth|) by the retention volumes 50 and 132.

In the writing period in the i-th row, the control circuit 3 changes potentials of the data signals Vd(j) in the j-th group to potentials corresponding to gradation levels of the pixels in the i-th row and the (3j−2)-th column, the i-th row and the (3j−1)-th column, and the i-th row and the 3j-th column. Meanwhile, the control circuit 3 exclusively brings the control signals Sel(1), Sel(2), and Sel(3) into a high level in accordance with the change of the potentials of the data signals. Although not illustrated in FIG. 4, the control circuit 3 also outputs the control signals /Sel(1), /Sel(2), and /Sel(3) which have the logical reverse relationship with the control signals Sel(1), Sel(2), and Sel(3), respectively. Accordingly, the demultiplexer 30 turns ON the transmission gates 34 in the leftmost end column, the center column, and the rightmost end column in this order in each of the groups.

Figure 9:
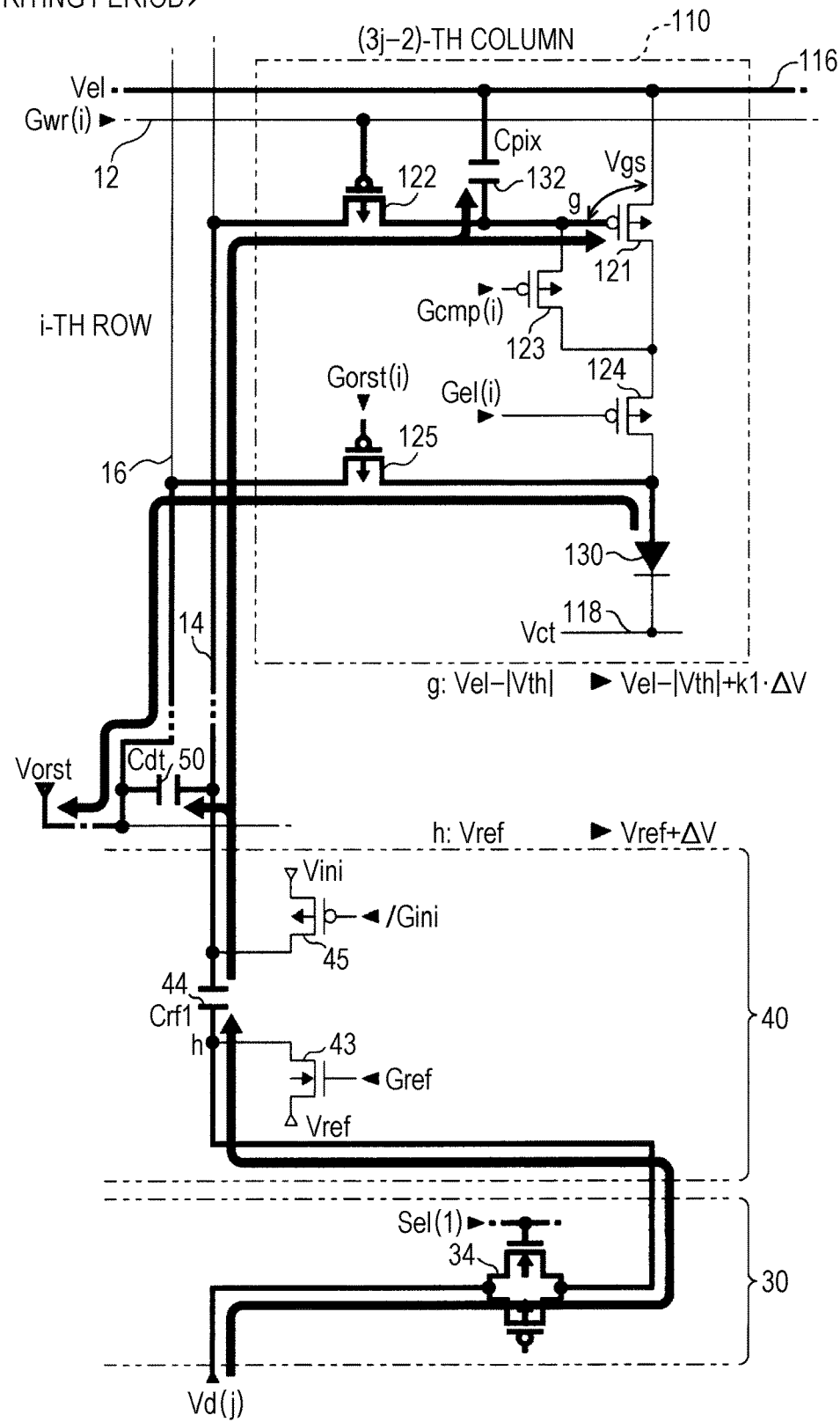
FIG. 9 is a diagram illustrating an operation of the electro-optical apparatus.

Here, when the transmission gate 34 in the leftmost end column is turned ON by the control signals Sel(1) and /Sel(1), as illustrated in FIG. 9, a potential of the node h at one end of the retention volume 44 is changed from the potential Vref fixed in the initialization period and the compensation period to the potential of the data signal Vd(j), that is, the potential corresponding to a gradation level of a pixel in the i-th row and the (3j−2)-th column. It is assumed here that the change of the potential of the node h at this time is denoted by "ΔV" and a potential after the change is denoted by (Vref+ΔV).

On the other hand, the gate node g is connected to one of the terminals of the retention volume 44 through the data line 14, and therefore, a value (Vel−|Vth|+k1·ΔV) is obtained by shifting the potential (Vel−|Vth|) in the compensation period to a rising direction by a value obtained by multiplying the potential change ΔV of the node h by a capacity ratio k1. Here, when the voltage Vgs of the transistor 121 is represented by an absolute value, a value (|Vth|+k1·ΔV) is obtained by subtracting a value of the shift of the potential rising of the gate node g from the threshold voltage |Vth|.

Note that the capacity ratio k1 is represented by "Crf1/(Cdt+Crf1)". Strictly speaking, although the capacitance Cpix of the retention volume 132 is required to be taken into consideration, the capacitance Cpix is ignored since the capacitance Cpix is set sufficiently smaller than the capacitances Crf1 and Cdt.

After the writing period in the i-th row is terminated and the one horizontal scanning period is terminated, the light emission period is entered. Since the control signal Gel(i) is brought into a low level in the light emission period as described above, the transistor 124 is turned ON in the pixel circuit 110 in the i-th row and the (3j−2)-th column. The voltage Vgs between the gate and the source is (|Vth|−k1·ΔV), and therefore, a current corresponding to a gradation level is supplied to the OLED 130 in a state in which the threshold voltage of the transistor 121 is compensated for as illustrated in FIG. 5.

Such an operation is executed on the pixel circuits 110 in the columns other than the (3j−2)-th column in the i-th row in parallel in terms of time in the i-th scanning period. Furthermore, such an operation in the i-th row is actually performed on the first to m-th rows in this order in one frame period, and the operation is repeatedly performed on individual frames.

According to this embodiment, a potential range ΔVgate in the gate node g may be narrowed relative to a potential range ΔVdata of the data signal, and therefore, a voltage to which a gradation level is reflected may be applied between the gate and the source of the transistor 121 without setting the potential of the data signal in high accuracy. Therefore, even in a case where a fine current supplied to the OLED 130 is considerably changed relative to a change of the voltage Vgs between the gate and the source of the transistor 121 in the fine pixel circuit 110, current to be supplied to the OLED 130 may be controlled with high accuracy.

Furthermore, a parasitic capacitance Cprs is disposed in practice between the data line 14 and the gate node g in the pixel circuit 110 as denoted by a dotted line in FIG. 3. Therefore, if a potential change width of the data line 14 is large, the gate node g is affected by the large potential change through the capacitance Cprs, and therefore, so-called crosstalk or unevenness is generated resulting in degradation of display quality. The influence of the capacitance Cprs is remarkable when the pixel circuit 110 is finely fabricated.

On the other hand, in this embodiment, a range of the potential change of the data line 14 may also be narrowed relative to the potential range ΔVdata of the data signal, and therefore, the influence through the capacitance Cprs may be suppressed.

The writing period is terminated when the scanning signal Gwr(i) is brought into a high level. A period of time from when the writing period is terminated to when the initialization period of the scanning line in the (i+1)-th row is started corresponds to the transition period. In this embodiment, the control signal Gorst(i) corresponding to an arbitrary scanning line is brought into a high level and the control signal Gel(i) is brought into a low level in the transition period so that the pixel circuits 110 connected to the scanning line may enter the light emission period. In this embodiment, the control signal Gorst(i) corresponding to an arbitrary scanning line is brought into a low level and the control signal Gel(i) is brought into a high level in the transition period so that the light emission period of the pixel circuits 110 connected to the scanning line may be terminated.

In FIG. 5, in the transition period immediately after the writing period of the pixel circuit 110 in the i-th row, the control signal Gorst(i) corresponding to the scanning line in the i-th row is brought into a high level and the control signal Gel(i) is brought into a low level so that the light emission period is started. Furthermore, in FIG. 5, at this timing, the light emission period of the pixel circuit 110 on the scanning line in an ia-th row which is different from the i-th row is started and the light emission period of the pixel circuit 110 on the scanning line in an ib-th row which is different from the i-th row and the ia-th row is terminated. The pixel circuits 110 operate in the light emission period as described above.

Control of Luminance of Entire Screen

Next, control of average luminance in the entire screen of the electro-optical apparatus 1 will be described. In the electro-optical apparatus 1 of this embodiment, the light emission period is generated twice in the pixel circuit 110 connected to the scanning line 12 in the i-th row in the frame period from when the scanning line 12 in the first row is selected to when the same scanning line 12 is selected next. Here, the average luminance in the entire screen is controlled by duty control in the light emission period of the light emitting element (the OLED 130).

Figure 10:
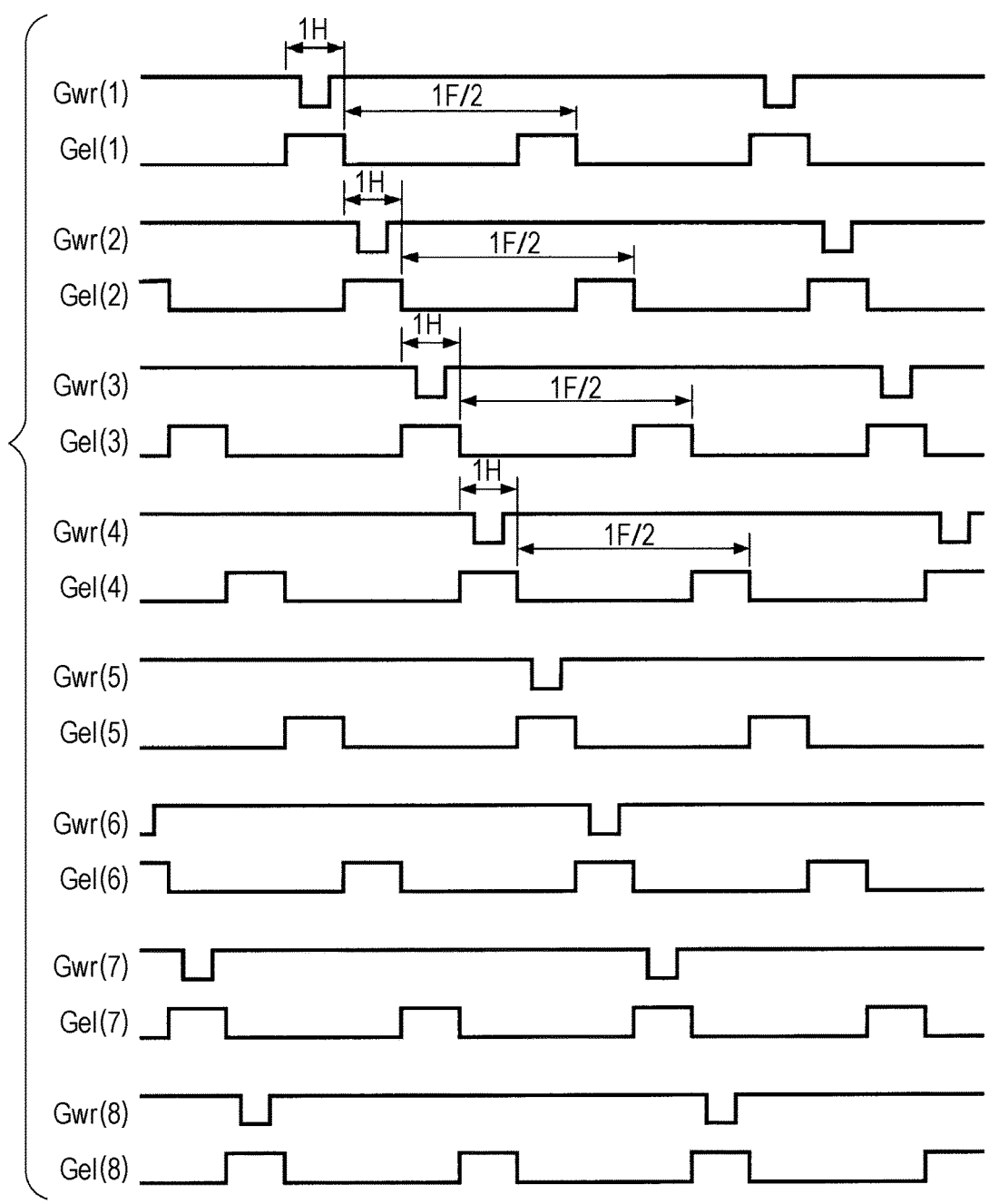
FIG. 10 is a timing chart illustrating an operation of the electro-optical apparatus.
Figure 11:
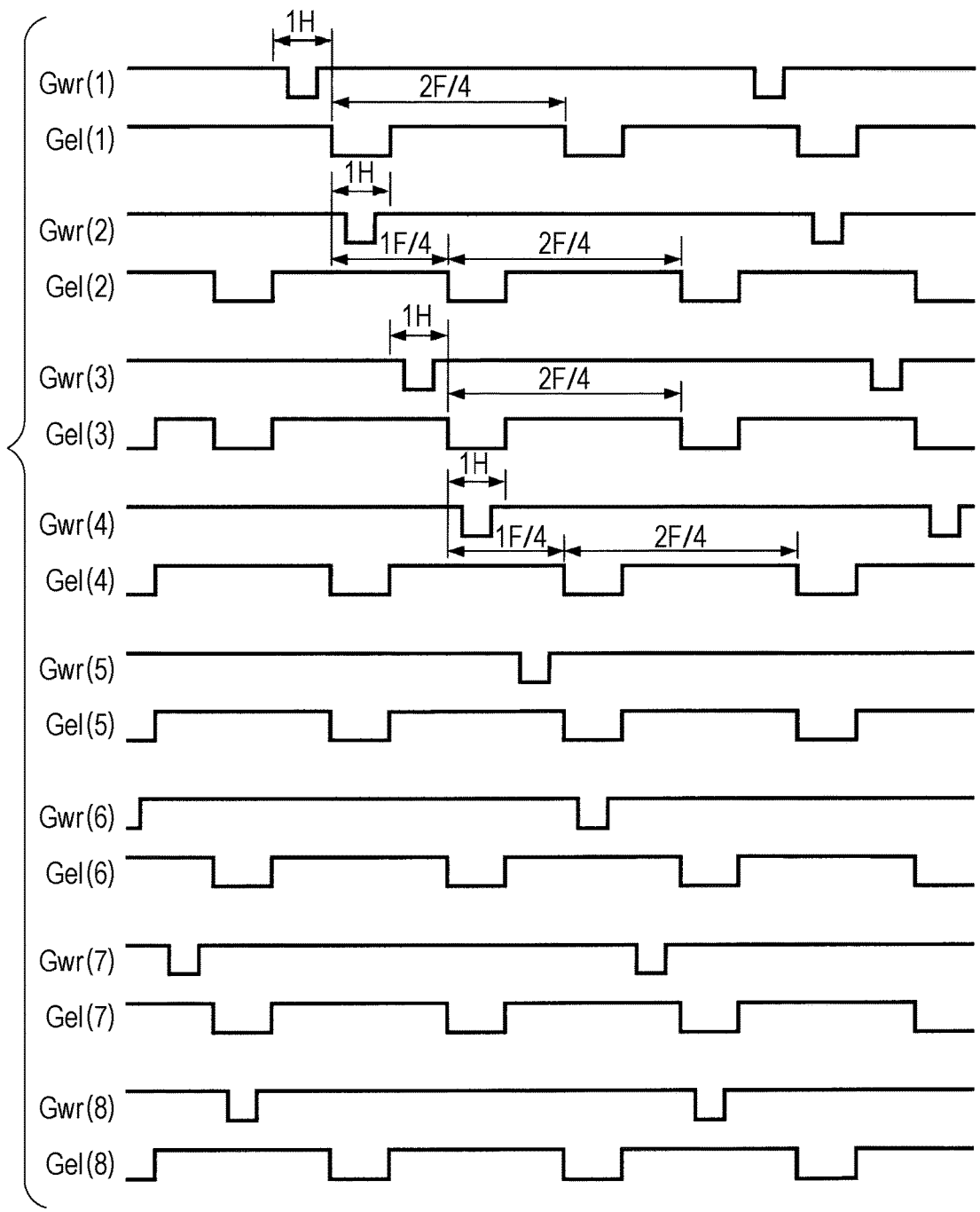
FIG. 11 is a timing chart illustrating an operation of the electro-optical apparatus.

FIGS. 10 and 11 are timing charts illustrating modes of the duty control in the light emission period according to this embodiment. For simplicity of description, the modes of the duty ratio control is illustrated taking a case where the number m of scanning lines 12 is 8 as an example.

In FIG. 10, a duty ratio represented by the duty ratio data DD is larger than the predetermined threshold value.

The horizontal synchronization signals HSYNC are successively supplied to first control signal generators 201(1) to 201(8) included in the scanning line driving circuit 20 in synchronization with the horizontal scanning cycle of the time length 1H. The first control signal generators 201(1) to 201(8) output scanning signals Gwr(1) to Gwr(8) and control signals Gcmp(1) to Gcmp(8) (not illustrated in FIGS. 10 and 11) when the horizontal synchronization signals HSYNC are supplied to the individual first control signal generators 201(1) to 201(8), and cause the pixel circuits 110 in the first to eighth rows to successively perform the operations in the initialization period, the compensation period, and the writing period (refer to FIG. 5).

Furthermore, delay controllers 202(1) to 202(8) in the scanning line driving circuit 20 output trigger signals twice in accordance with the horizontal synchronization signals HSYNC individually applied to the delay controllers 202(1) to 202(8). In this case, a duty ratio represented by the duty ratio data DD is larger than the predetermined threshold value. Therefore, the delay controllers 202(1) to 202(8) output first trigger signals in the transition periods in the horizontal scanning period started when the horizontal synchronization signals HSYNC(1) to HSYNC(8) are supplied and output second trigger signals in the transition periods which start 1F/2 after the timings when the first trigger signals are output.

The second control signal generators 203(1) to 203(8) included in the scanning line driving circuit 20 output, as control signals Gel(1) to Gel(8), negative pulses having pulse widths corresponding to the duty ratios denoted by the duty ratio data DD every time a trigger signal is supplied.

Therefore, as illustrated in FIG. 10, in the individual pixel circuits 110 connected to the scanning line in the first row, the control signal Gel(1) is brought into a low level and a first light emission period is started in the transition period included in the horizontal scanning period in which a data signal is written. Then the control signal Gel(1) is brought into a low level again in the transition period which starts 1F/2 after the first light emission period, and a second light emission period is started.

Furthermore, the control signal Gel(1) maintains the low level in a period corresponding to the duty ratio denoted by the duty ratio data DD after the control signal Gel(1) is first brought into a low level and is second brought into a low level. Specifically, in a case where the duty ratio represented by the duty ratio data DD is $\alpha$, the control signal Gel(1) maintains the low level for a period of time corresponding to $\alpha(1F/2)$ after the control signal Gel(1) is first and second brought into the low level.

The same is true in the individual pixel circuits 110 connected to the scanning lines in the second to eight rows, and start timings of the light emission period is generated in the transition period in the horizontal scanning period in which a data signal is written and the transition period which starts 1F/2 after the foregoing transition period.

In FIG. 11, the duty ratio represented by the duty ratio data DD is equal to or smaller than the predetermined threshold value. In this case, operations of the first control signal generation units 201(1) to 201(8) in the scanning line driving circuit 20 are the same as the case where the duty ratio represented by the duty ratio data DD is larger than the predetermined threshold value.

Furthermore, delay controllers 202(1) to 202(8) in the scanning line driving circuit 20 output trigger signals twice in accordance with the horizontal synchronization signals HSYNC(1) to HSYNC(8) applied to the delay controllers 202(1) to 202(8), respectively. A generation mode of the trigger signals in the delay controllers 202(1), 202(3), 202(5), and 202(7) corresponding to the odd-numbered scanning lines is different from a generation mode of the trigger signals in the delay controllers 202(2), 202(4), 202(6), and 202(8) corresponding to the even-numbered scanning lines.

The delay controllers 202(1), 202(3), 202(5), and 202(7) corresponding to the odd-numbered scanning lines output first trigger signals in the transition periods in the horizontal scanning periods starting in response to the horizontal synchronization signals HSYNC(1), HSYNC(3), HSYNCH(5), and HSYNCH(7), and output second trigger signals in the transition periods 1F/2 after the foregoing transition periods.

On the other hand, the delay controllers 202(2), 202(4), 202(6), and 202(8) corresponding to the even-numbered scanning lines output first trigger signals in the transition periods 1F/4 after the transition periods in the horizontal scanning periods starting in response to the horizontal synchronization signals HSYNC(2), HSYNC(4), HSYNCH(6), and HSYNCH(8), and output second trigger signals in the transition periods 1F/2 after the foregoing transition periods.

Therefore, as illustrated in FIG. 11, in the individual pixel circuits 110 connected to the scanning lines in the odd-numbered rows, the control signal Gel(i) is brought into a low level and a first light emission period is started in the transition period included in the horizontal scanning period in which a data signal is written. Then the control signal Gel(i) is brought into a low level again in the transition period which starts 1F/2 after the first light emission period, and a second light emission period is started. On the other hand, in the individual pixel circuits 110 connected to the scanning lines in the even-numbered rows, the control signal Gel(i) is brought into a low level and a first light emission period is started in the transition period which starts 1F/4 after the transition period included in the horizontal scanning period in which a data signal is written. Then the control signal Gel(i) is brought into a low level again in the transition period which starts 1F/2 after the transition period and a second light emission period is started.

As described above, according to this embodiment, start timings of the light emission periods are dispersed among the pixel circuits 110 connected to the adjacent scanning lines. Accordingly, an afterimage generated when a duty ratio is small in the light emission period may be suppressed. Note that the predetermined threshold value of the duty ratio is a value of approximately 25%. As illustrated as the even-numbered scanning lines in FIG. 11, a start timing of the second light emission period is shifted to a timing 3F/4 after a timing of a current value setting, and therefore, the light emission period may be increased to approximately 1F/4.

Furthermore, according to this embodiment, start timings of the light emission periods are dispersed only when the duty ratio is equal to or smaller than the predetermined threshold value, and therefore, an afterimage may be controlled without deteriorating tolerance of the duty ratio control. It is assumed here that a process of dispersing start timings of the light emission periods is unlimitedly performed. In this case, assuming that a start timing of the light emission period corresponds to a position of a half of the one frame period 1F after a timing when a data signal is written, a length of the light emission period is limited to a half of one frame period 1F or less. However, according to this embodiment, the process of dispersing start timings of the light emission periods is performed only when the duty ratio is equal to or smaller than the predetermined threshold value, and therefore, an the duty ratio may be controlled without such limitation.

Furthermore, in this embodiment, the two light emission periods are generated per one pixel circuit in one frame period. Therefore, flicker in screen may be efficiently suppressed.

Furthermore, in this embodiment, the switching from non-light emission to light emission and the switching from light emission to non-light emission of the OLED 130 are performed in a period other than the current value setting period. Therefore, an adverse effect, on the current value setting operation performed by the pixel circuit 110, of power source noise generated when the switching from non-light emission to light emission or the switching from light emission to non-light emission of the OLED 130 is performed may be avoided.

Modifications

The present disclosure is not limited to the foregoing embodiment, and various modifications described below, for example, may be made. Furthermore, one of modes of the modifications described below may be employed or a plurality of the modes which are arbitrarily selected may be appropriately combined.

First Modification

In the foregoing embodiment, two types of time differences of the start timings of the light emission period relative to the current value setting timings are provided. In the foregoing embodiment, a first time difference is employed in a group of the scanning lines in the odd-numbered rows and a second time difference is employed in a group of the scanning lines in the even-numbered rows so that start timings of the light emission periods are dispersed. However, the mode in which the start timings of the light emission periods are dispersed is not limited to this. A number of types of time difference, which is larger than 2, of the start timings of the light emission periods relative to the current value setting timings may be provided.

Figure 12:
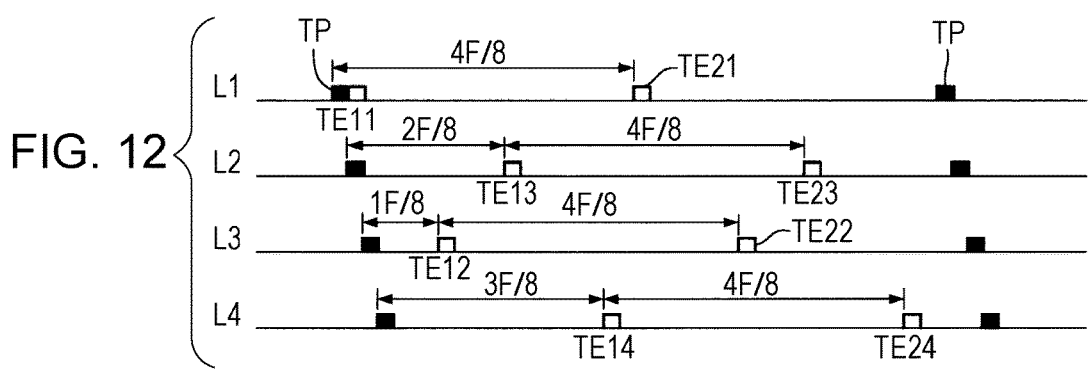
FIG. 12 is a timing chart illustrating an operation of the electro-optical apparatus.

In FIG. 12, in a scanning line L1 in which a remainder obtained when a number of a scanning line is divided by 4 is 1, a scanning line L2 having such a remainder of 2, a scanning line L3 having such a remainder of 3, and a scanning line L4 having such a remainder of 0, current value setting timings TP and start timings TE11 to TE14 and TE21 to TE24 of the light emission periods in the pixel circuits 110 connected to the individual scanning lines are illustrated. In this example, duty ratios in the light emission periods are equal to or smaller than the predetermined threshold value, and the start timings of the light emission periods are dispersed.

In this example, as time differences between the current value setting timings TP and the start timings of the light emission periods, four types of time difference, that is, 0F/8 (not illustrated in FIG. 12), 1F/8, 2F/8, and 3F/8 are used. Specifically, in this example, four timings with an interval of 1F/8 therebetween in a half of one frame period 1F are determined as light emission period start candidate positions, and start timings of the light emission periods of the pixel circuits 110 in the scanning lines L1 to L4 correspond to the four light emission period start candidate positions.

Specifically, in the pixel circuits 110 connected to the scanning line L1, a transition period in a horizontal scanning period including a current value setting timing TP is set as the start timing TE11 of a first light emission period, and a timing after 4F/8 of the start timing TE11 is set as the start timing TE21 of a second light emission period.

Furthermore, in the pixel circuits 110 connected to the scanning line L2, a transition period 2F/8 after the transition period in the horizontal scanning period including the current value setting timing TP is set as the start timing TE13 of the first light emission period, and a timing after 4F/8 of the start timing TE13 is set as the start timing TE23 of the second light emission period.

Furthermore, in the pixel circuits 110 connected to the scanning line L3, a transition period 1F/8 after the transition period in the horizontal scanning period including the current value setting timing TP is set as the start timing TE12 of the first light emission period, and a timing after 4F/8 of the start timing TE12 is set as the start timing TE22 of the second light emission period.

Furthermore, in the pixel circuits 110 connected to the scanning line L4, a transition period 3F/8 after the transition period in the horizontal scanning period including the current value setting timing TP is set as the start timing TE14 of the first light emission period, and a timing after 4F/8 of the start timing TE14 is set as the start timing TE24 of the second light emission period.

According to this mode, types of time difference is increased when compared with the foregoing embodiment, and therefore, an afterimage suppression effect may be enhanced.

Figure 13:
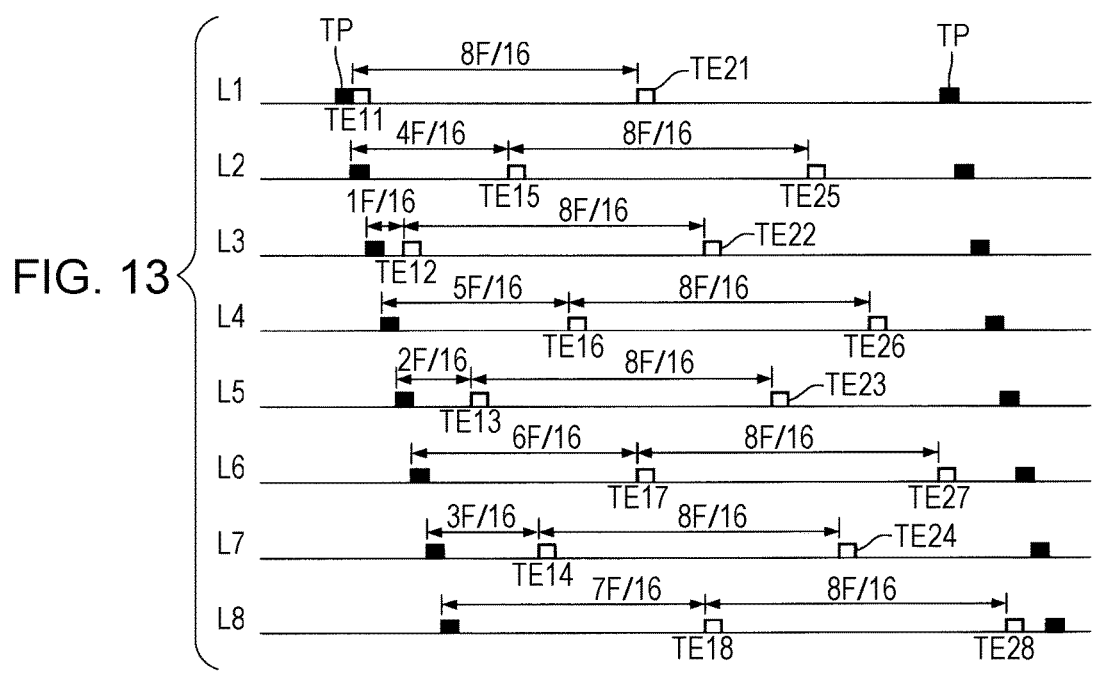
FIG. 13 is a timing chart illustrating an operation of the electro-optical apparatus.

In FIG. 13, in scanning lines L1 to L8 in which a remainder obtained when a number of a scanning line is divided by 8 is one of 1 to 7 and 0, current value setting timings TP in the pixel circuits 110 connected to the individual scanning lines and start timings TE11 to TE18 and TE21 to TE28 in the pixel circuits 110 connected to the individual scanning lines are illustrated. In this example, as time differences between the current value setting timings TP and the start timings of the light emission periods, eight types of time difference, that is, 0F/16 (not illustrated in FIG. 13), 1F/16, 2F/16, 3F/16, 4F/16, 5F/16, 6F/16, and 7F/16 are used. Specifically, in this example, eight timings with an interval of 1F/16 therebetween in a half of the one frame period 1F are determined as light emission period start candidate positions, and start timings of the light emission periods of the pixel circuits 110 in the scanning lines L1 to L8 correspond to the eight light emission period start candidate positions.

According to this mode, types of time difference is increased when compared with the example in FIG. 12, and therefore, an afterimage suppression effect may further be enhanced.

Second Modification

Although the two light emission periods are generated in the one frame period 1F in the foregoing embodiment, only one light emission period may be generated.

Figure 14:
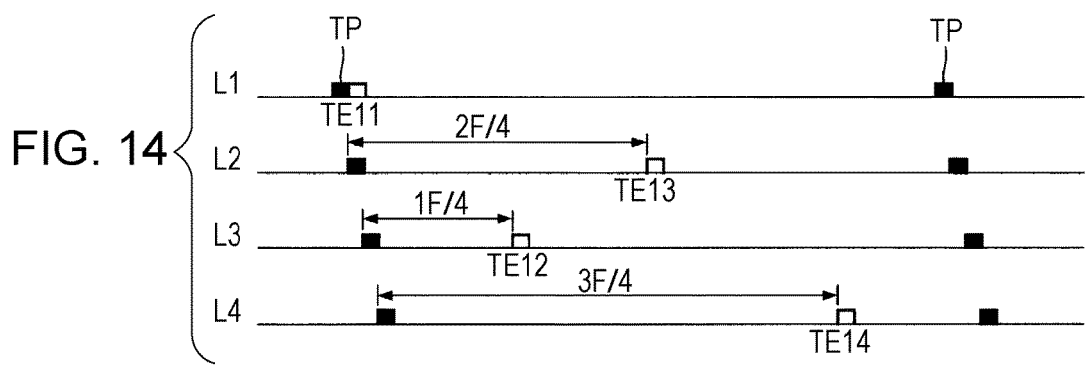
FIG. 14 is a timing chart illustrating an operation of the electro-optical apparatus.

In FIG. 14, in the scanning lines L1 to L4 in which a remainder obtained when a number of a scanning line is divided by 4 is one of 1 to 3 and 0, current value setting timings TP and start timings TE11 to TE14 of light emission periods in the pixel circuits 110 connected to the individual scanning lines are illustrated. In this example, duty ratios in the light emission periods are equal to or smaller than the predetermined threshold value, and the start timings of the light emission periods are dispersed. In this case, the threshold value is approximately 50%. In this example, a start timing of a light emission period is shifted from a timing 2F/4 after the current value setting timing, and therefore, the light emission period may be increased to approximately 2F/4.

In this example, as time differences between the current value setting timings TP and the start timings of the light emission periods, four types of time difference, that is, 0F/4 (not illustrated in FIG. 14), 1F/4, 2F/4, and 3F/4 are used. Specifically, in this example, four timings with an interval of 1F/4 therebetween in the one frame period 1F are determined as light emission period start candidate positions, and start timings of the light emission periods of the pixel circuits 110 in the scanning lines L1 to L4 correspond to the four light emission period start candidate positions.

Figure 15:
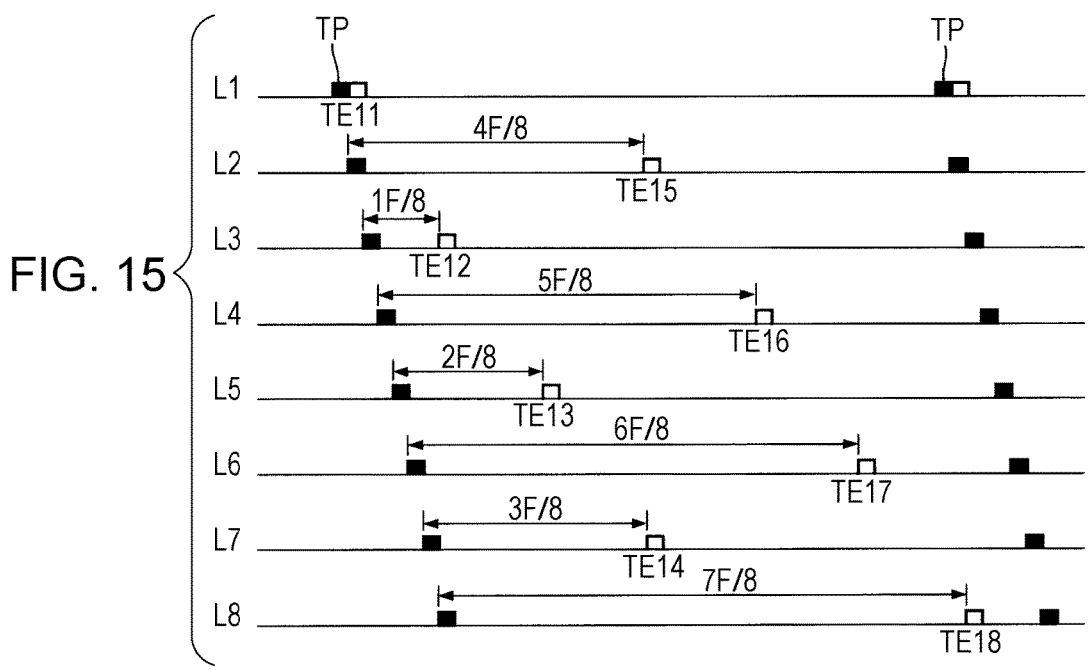
FIG. 15 is a timing chart illustrating an operation of the electro-optical apparatus.

In FIG. 15, in the scanning lines L1 to L8 in which a remainder obtained when a number of a scanning line is divided by 8 is one of 1 to 7 and 0, current value setting timings TP and start timings TE11 to TE18 of light emission periods in the pixel circuits 110 connected to the individual scanning lines are illustrated. In this example, duty ratios in the light emission periods are equal to or smaller than the predetermined threshold value, and the start timings of the light emission periods are dispersed.

In this example, as time differences between the current value setting timings TP and the start timings of the light emission periods, eight types of time difference, that is, 0F/8 (not illustrated in FIG. 15), 1F/8, 2F/8, 3F/8, 4F/8, 5F/8, 6F/8, and 7F/8 are used. Specifically, in this example, eight timings with an interval of 1F/8 therebetween in the one frame period 1F are determined as light emission period start candidate positions, and start timings of the light emission periods of the pixel circuits 110 in the scanning lines L1 to L8 correspond to the eight light emission period start candidate positions.

When compared with the cases of FIGS. 14 and 15, in a case where the number of types of time differences of the start timings of the light emission periods corresponding to the current value setting timings is increased, a degree of dispersion of the start timings of the light emission periods may be enhanced. Accordingly, an effect of suppression of generation of an afterimage may be enhanced.

Third Modification

Types of time difference between start timings of light emission periods relative to current value setting timings are not limited to the foregoing embodiment and the first and second modifications. When the number of scanning lines is 720, 2, 4, 8, 16, . . . , or 360 types of time difference may be employed.

Fourth Modification

In the foregoing embodiment and the first to third modifications, a start timing of a light emission period is selected from among a plurality of light emission period start candidate positions arranged with an even time interval in one frame period 1F. However, the plurality of light emission period start candidate positions may not be strictly arranged with an even time interval and may be arranged with a substantially even time interval.

Fifth Modification

If the time difference of the start timings of the light emission periods relative to the current value setting timing is dispersed among pixels, a group including a plurality of pixels which simultaneously start the light emission periods is generated. If such a group is generated, large power source noise is generated at a timing when all the pixels in the group start light emission, and accordingly, operation of the electro-optical apparatus may become unstable. Therefore, start timings (dispersed start timings) in the light emission periods of the pixel circuits 110 connected to all the scanning lines are determined in accordance with the following procedure.

First, as illustrated in the foregoing embodiment and the first and second modifications, a plurality of light emission period start candidate positions arranged with an even time interval in one frame period 1F are obtained in the pixel circuits 110 connected to the individual scanning lines, and one of the plurality of light emission period start candidate positions is set to one of start timings of the light emission periods of the pixel circuits 110 connected to the individual scanning lines.

Subsequently, the start timings of the light emission periods of the pixel circuits 110 connected to the scanning lines are adjusted. Specifically, the start timings of the light emission periods of the pixel circuits 110 are adjusted such that the pixel circuits 110 connected to the scanning lines are divided into a plurality of groups according to a start timing of a light emission period and the numbers of pixels included in the individual groups are equal to each other.

According to this mode, the number of pixels in which the switching from non-light emission to light emission and the switching from light emission to non-light emission of the OLED 130 are simultaneously performed is constant, and therefore, large instantaneous consumption current may be prevented from flowing, and accordingly, the operation of the electro-optical apparatus may become stable.

Sixth Modification

Figure 16:
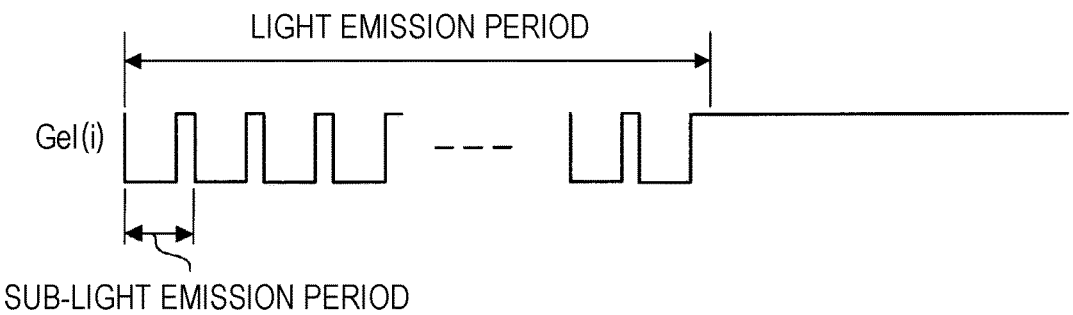
FIG. 16 is a timing chart illustrating an operation of the electro-optical apparatus.

One light emission period in the foregoing embodiment may be divided into a plurality of sub-light emission periods so that duty ratios of the sub-light emission periods are controlled. Specifically, as illustrated in FIG. 16, the light emission period is divided into a plurality of sub-periods having a length of 10H (corresponding to a time length of 10 horizontal scanning periods) and the number of horizontal scanning periods in which light emission is performed in the sub-periods of 10H is controlled based on the duty ratio data DD.

According to this mode, luminance may be more finely adjusted.

Seventh Modification

In the foregoing embodiment, the delay controller 202(i) may be realized by a shift register, a counter, or the like. Alternatively, in FIG. 4, the delay controller 202(i) to which the horizontal synchronization signal HSYNC(i) is supplied may obtain a horizontal synchronization signal HSYNC(i+k) from the shift register 200 and use the horizontal synchronization signal HSYNC(i+k) as a trigger signal which delays from the timing of the horizontal synchronization signal HSYNC(i) by kH.

Eighth Embodiment

Although the transistors 121 to 125 are P-channel type transistors according to the foregoing embodiment, all the transistors 121 to 125 may be N-channel type transistors. Furthermore, P-channel type transistors and N-channel type transistors may be appropriately employed in combination.

For example, in a case where all the transistors 121 to 125 are N-channel type transistors, a positive or negative potential which is reversed from a potential of the data signal Vd(n) in the foregoing embodiment is supplied to the pixel circuits 110. In this case, sources and drains of the transistors 121 to 125 have the reversed relationship with the foregoing embodiment and the foregoing modifications.

Ninth Modification

Although the OLED 130 which is a light emitting element is illustrated as an electro-optical element in the foregoing embodiment and the foregoing modifications, an inorganic light emission diode, a light emitting diode (LED), or the like may be employed as long as light having luminance corresponding to current is emitted.

Tenth Modification

Although data is written in the pixel circuits 110 by transferring charge to the pixel circuits 110 using the data transfer circuit 40 in the foregoing embodiment and the foregoing modifications, the present disclosure is not limited to this. Furthermore, although each of the pixel circuits 110 is constituted by the five transistors 121 to 125, the present disclosure is not limited to this, and the transistors 123 and 125 may be appropriately omitted. Specifically, each of the pixel circuits 110 may only include the transistor 122 for writing, the transistor 121 for driving, and the transistor 124 for light emission control.

Applications

Next, an electronic apparatus employing the electro-optical apparatus 1 according to the foregoing embodiment or one of the foregoing modifications will be described. The electro-optical apparatus 1 is suitably employed in high-definition display with small sized pixels. Therefore, a head mounted display is taken as an example of the electronic apparatus in the following description.

Figure 17:
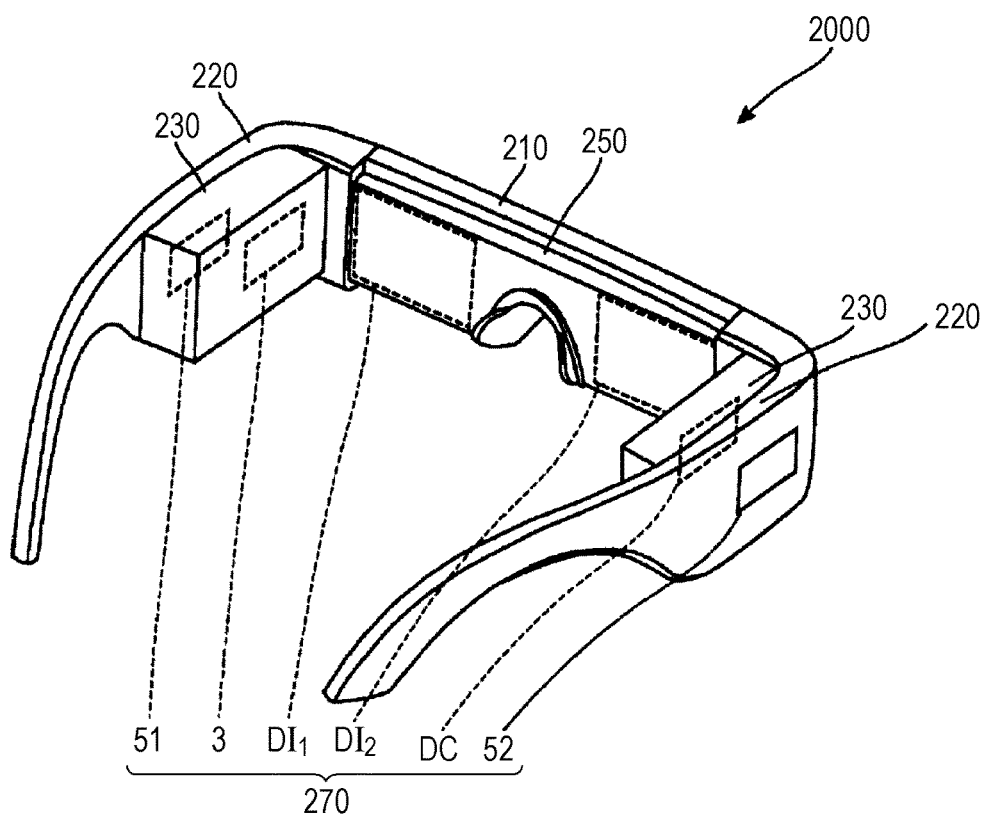
FIG. 17 is a diagram illustrating a configuration of appearance of a head mounted display (HMD).

FIG. 17 is a diagram schematically illustrating a state in which the electro-optical apparatus according to the present disclosure is applied to a head mounted display. As illustrated in FIG. 17, a head mounted display 2000 according to this embodiment includes a front frame 210 positioned in front of a head portion of a user, a pair of side frames 220 which are coupled with opposite ends of the front frame 210 and which are positioned opposite sides of the head portion, an optical panel 250 which is fixed on the front frame 210 and which covers eyes, circuit covers 230 which are fixed in the respective side frames 220, and an electro-optical apparatus 270. Here, the electro-optical apparatus 270 has a function of controlling luminance of a screen in accordance with the foregoing embodiment and the sixth modification.

The number of display panels in electro-optical apparatus 270 of this embodiment is 2. Furthermore, a configuration of the electro-optical apparatus 270 is the same as the electro-optical apparatus 1 of the foregoing embodiment expect that the electro-optical apparatus 270 includes a luminance balance control input unit 51 and an entire-luminance control input unit 52.

A pair of display panels $DI_1$ and $DI_2$ is disposed inside the optical panel 250. Specifically, the display panel $DI_1$ is disposed in front of a left eye and the display panel $DI_2$ is disposed in front of a right eye. Light emitted from the display panels $DI_1$ and $DI_2$ are further emitted from the optical panel 250. The display panel $DI_1$ is visually recognized by the left eye of the user and the display panel $DI_2$ is visually recognized by the right eye of the user.

In the head mounted display 2000 of this embodiment, the luminance balance control input unit 51 is disposed operable on one of the side frames 220 and the entire-luminance control input unit 52 is disposed operable on the other of the side frames 220. The luminance balance control input unit 51 supplies duty ratio data indicating a duty ratio of duty control of the sixth modification described above to the scanning line driving circuit 20, and the entire-luminance control input unit 52 supplies duty ratio data indicating a duty ratio of duty control of the foregoing embodiment to the scanning line driving circuit 20. Furthermore, in the head mounted display 2000 of this embodiment, the control circuit 3 is disposed inside one of the circuit covers 230 fixed to the side frames 220 and a power source circuit DC is disposed inside the other of the circuit covers 230 fixed to the side frames 220. However, the arrangement may be appropriately changed.

In general, a user who uses the head mounted display requests change of luminance of an image viewed by the user. To address this request, according to the head mounted display 2000 of this embodiment, luminance of an image may be changed by changing entire luminance of the electro-optical apparatus 270 as with the description of the foregoing embodiment. Furthermore, in a case where the display panels $DI_1$ and $DI_2$ are paired, the display panel $DI_1$ is visually recognized by one of eyes of a person, and the display panel $DI_2$ is visually recognized by the other of the eyes of the person, if luminance of the display panel $DI_1$ is different from luminance of the display panel $DI_2$, the user intends to feel strange and makes a request for controlling the luminance of the left and right display panels $DI_1$ and $DI_2$. To address this request, according to the head mounted display 2000 of this embodiment, as with the description in the foregoing embodiment, luminance balance between the left and right display panels $DI_1$ and $DI_2$ may be controlled by the method described in the foregoing embodiment in the electro-optical apparatus 270. Thereafter, the change of luminance of an image and the control of luminance balance between the left and right display panels $DI_1$ and DI2 may be independently performed.

Figure 18:
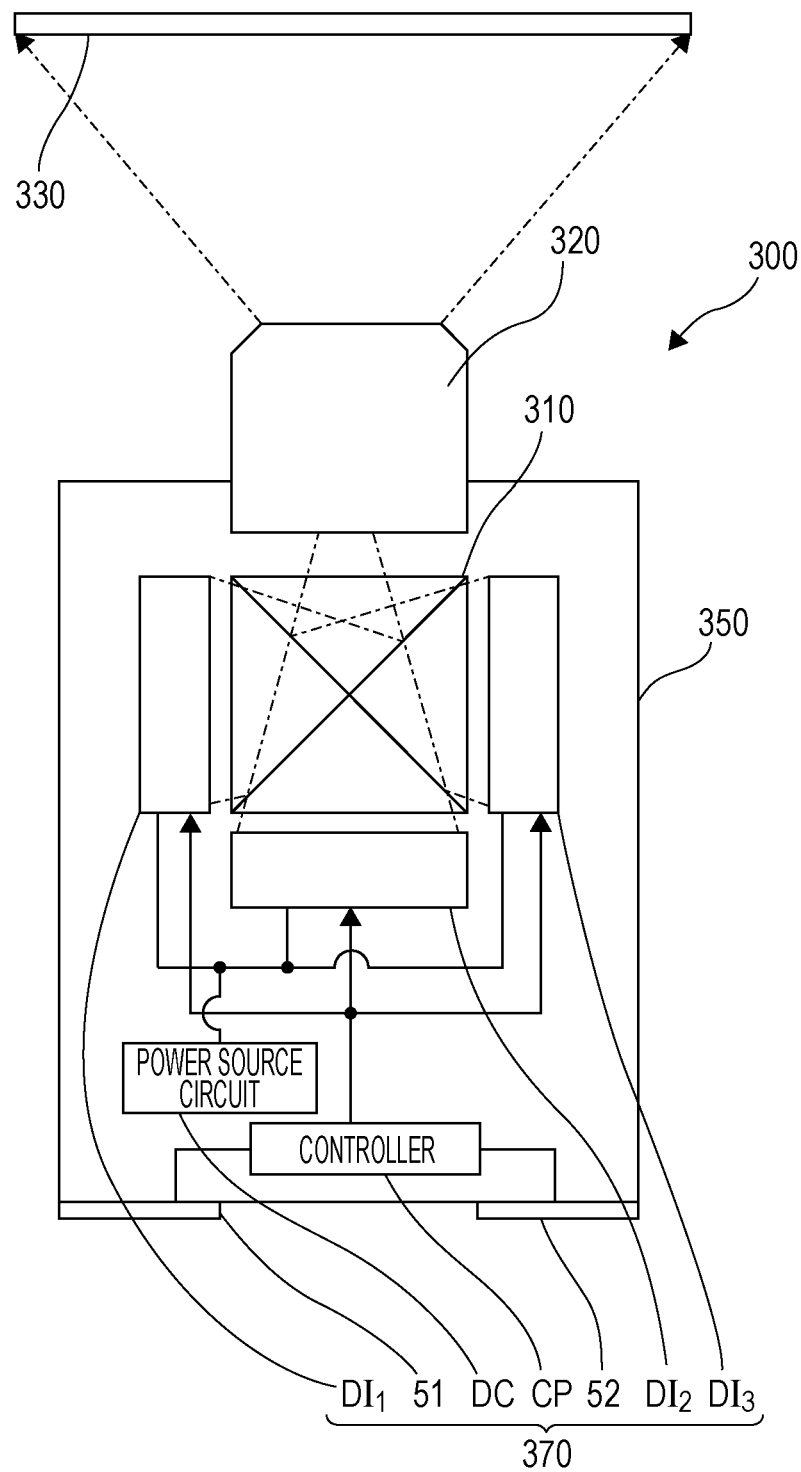
FIG. 18 is a diagram illustrating an optical configuration of a projector.

FIG. 18 is a diagram schematically illustrating a state in which the electro-optical apparatus according to the present disclosure is applied to a projector. As illustrated in FIG. 18, a projector 300 includes a case 350, an electro-optical apparatus 370, a dichroic prism 310, and a projection lens 320.

The number of display panels in the electro-optical apparatus 370 of this embodiment is 3. Furthermore, a configuration of the electro-optical apparatus 270 is the same as the electro-optical apparatus 1 of the foregoing embodiment expect that the electro-optical apparatus 270 includes a luminance balance control input unit 51 and an entire-luminance control input unit 52.

Display panels $DI_1$, $DI_2$, and $DI_3$ are disposed inside the case 350, and pixel arrays PA of the display panels $DI_1$, $DI_2$, and $DI_3$ include pixels P of a single color. In this embodiment, the display panel $DI_1$ displays a red image, the display panel $DI_2$ displays a green image, and the display panel $DI_3$ displays a blue image. Furthermore, the display panels $DI_1$, $DI_2$, and $DI_3$ are disposed such that light emission directions of the adjacent display units are orthogonal to each other. In this embodiment, the display panels $DI_1$ and $DI_2$ are disposed adjacent to each other, the display panels $DI_2$ and $DI_3$ are disposed adjacent to each other, and the display panels $DI_1$ and $DI_3$ are disposed opposite to each other.

The dichroic prism 310 is disposed in a position surrounded by the display panels $DI_1$, $DI_2$, and $DI_3$, and the display panels $DI_1$, $DI_2$, and $DI_3$ face respective light incident surfaces, that is, side surfaces, of the dichroic prism 310. Furthermore, the projection lens 320 is disposed on a light emission surface side of the dichroic prism 310, and light may be emitted from the case 350 through the projection lens 320. Note that the projection lens 320 may be constituted by a single lens or a plurality of lenses.

Furthermore, the luminance balance control input unit 51 and the entire-luminance control input unit 52 are disposed operable outside the case 350. When the projector 300 is used, red light emitted from the display panel $DI_1$, green light emitted from the display panel $DI_2$, and blue light emitted from the display panel $DI_3$ are superposed with each other so that a color image obtained by superposing the red image, the green image, and the blue image with one another is displayed in a screen 330. Note that this screen 330 may be a light transmission type screen or a light reflection type screen.

When the projector 300 is to be used, a change of luminance of light emitted from the projector 300 in accordance with brightness of a room where the projector 300 is to be used is demanded. To address this demand, according to the projector 300 of this embodiment, luminance of light emitted from the projector 300 may be changed by changing entire luminance of the electro-optical apparatus 370 as with the description of the foregoing embodiment. Furthermore, control of white balance is demanded in an apparatus which displays a color image, such as the projector 300 of this embodiment. To address this demand, according to the projector 300 of this embodiment, the duty ratio control according to the fifth modification is performed for each color so that luminance balance among the display panels $DI_1$, $DI_2$, and $DI_3$ of the electro-optical apparatus 370 may be controlled. In this way, luminance balance among red, green blue may be controlled and white balance may be controlled. Then the change of the luminance of light emitted from the projector 300 and the control of the white balance may be independently performed.

In this embodiment, light emitted from the display panels $DI_1$, $DI_2$, and $DI_3$ is not limited to specific colors, that is, red, green, and blue, and other colors of light may be emitted.

Furthermore, although the case where the display panels $DI_1$, $DI_2$, and $DI_3$ display images of red, green, and blue, respectively, is described in the foregoing embodiment, the display panels $DI_1$, $DI_2$, and $DI_3$ may become light source of red, light, green light, and blue light, respectively, without displaying images. In this case, liquid crystal panels or the like are disposed in front of the display panels $DI_1$, $DI_2$, and $DI_3$ so that images are displayed on the liquid crystal panels based on the light emitted from the display panels $DI_1$, $DI_2$, and $DI_3$.

Note that the electro-optical apparatus 1 is applicable to, in addition to the head mounted display 2000, an electronic view finder employed in video cameras, lens-exchangeable digital still cameras, a mobile information terminal such as a tablet terminal, a watch, and an information display unit of a projector.

The entire disclosure of Japanese Patent Application No. 2017-050918, filed Mar. 16, 2017 is expressly incorporated by reference herein.

What is claimed is:

1. An electro-optical apparatus comprising:
a plurality of pixels each of which includes a light emitting element which emits light based on a driving current; and
a driving circuit configured to select arbitrary one of the plurality of pixels, cause the pixel to perform a current value setting operation of setting a current value of the driving current to be supplied to the light emitting element of the pixel in a frame period before the pixel is selected again and a light emission operation of emitting light by supplying the driving current to the light emitting element, and control, in common with the plurality of pixels, a duty ratio corresponding to the frame period of the light emission period in which the light emission operation is performed,
wherein the driving circuit disperses time differences between a current value setting timing when the current value setting operation is performed and a start timing of the light emission period, in the plurality of pixels when the duty ratio is equal to or smaller than a predetermined value.

2. The electro-optical apparatus according to claim 1, wherein the driving circuit sets each of start timings of the light emission periods of the plurality of pixels in one of a plurality of light emission period start candidate positions arranged with a substantially even time interval in the frame period.

3. The electro-optical apparatus according to claim 1, wherein each of the pixels includes a driving transistor which generates the driving current, and
the driving circuit causes the pixel to perform a compensation operation of compensating for a threshold voltage of the driving transistor when the pixel performs the current value setting operation and determines a start timing and an end timing of the light emission period while avoiding a period in which the current value setting operation is performed.

4. The electro-optical apparatus according to claim 1, wherein the plurality of pixels are divided into a plurality of groups according to a start timing of the light emission period, and the numbers of pixels which belong to the groups are equal to one another.

5. The electro-optical apparatus according to claim 1, wherein the driving circuit divides one light emission period into a plurality of sub-light emission periods and performs control of duty ratios of the sub-light emission periods.

6. The electro-optical apparatus according to claim 1, wherein the driving circuit generates a plurality of light emission periods in one frame period.

7. An electronic apparatus comprising the electro-optical apparatus according to claim 1.

8. An electronic apparatus comprising the electro-optical apparatus according to claim 2.

9. An electronic apparatus comprising the electro-optical apparatus according to claim 3.

10. An electronic apparatus comprising the electro-optical apparatus according to claim 4.

11. An electronic apparatus comprising the electro-optical apparatus according to claim 5.

12. An electronic apparatus comprising the electro-optical apparatus according to claim 6.

13. A method for driving an electro-optical apparatus including a plurality of pixels each of which includes a light emitting element which emits light based on a driving current, the method comprising:

selecting arbitrary one of the plurality of pixels, causing the pixel to perform a current value setting operation of setting a current value of the driving current to be supplied to the light emitting element of the pixel in a frame period before the pixel is selected again and a light emission operation of emitting light by supplying the driving current to the light emitting element, and controlling, in common with the plurality of pixels, a duty ratio corresponding to the frame period of the light emission period in which the light emission operation is performed; and dispersing time differences between a current value setting timing when the current value setting operation is performed and a start timing of the light emission period, in the plurality of pixels when the duty ratio is equal to or smaller than a predetermined value.

* * * * *